(12) United States Patent
Irie

(10) Patent No.: US 6,710,847 B1
(45) Date of Patent: Mar. 23, 2004

(54) EXPOSURE METHOD AND EXPOSURE APPARATUS

(75) Inventor: Nobuyuki Irie, Kawasaki (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/830,501

(22) PCT Filed: Nov. 8, 1999

(86) PCT No.: PCT/JP99/06201

§ 371 (c)(1),
(2), (4) Date: Apr. 27, 2001

(87) PCT Pub. No.: WO00/28380

PCT Pub. Date: May 18, 2000

(30) Foreign Application Priority Data

Nov. 6, 1998 (JP) ............................................ 10-316129

(51) Int. Cl.⁷ ........................ G03B 27/42; G03B 27/52; G03B 27/32; G06K 7/10; G03F 9/00

(52) U.S. Cl. ............................. 355/53; 355/55; 355/77; 430/5; 235/462.05

(58) Field of Search ............................. 355/53, 55, 77; 356/399, 400, 401; 235/462.05; 716/21; 250/548; 430/5

(56) References Cited

U.S. PATENT DOCUMENTS

| | | | |
|---|---|---|---|
| 5,461,237 A | * 10/1995 | Wakamoto et al. | ......... 250/548 |
| 5,486,896 A | 1/1996 | Hazama et al. | |
| 5,841,520 A | * 11/1998 | Taniguchi | ................ 355/53 |
| 6,213,607 B1 | 4/2001 | Watanabe et al. | |
| 6,463,577 B1 | * 10/2002 | Omata et al. | ................. 716/21 |
| 2001/0020643 A1 | * 9/2001 | Matsumoto et al. | ... 235/462.05 |

* cited by examiner

*Primary Examiner*—Russell Adams
*Assistant Examiner*—Peter B Kim
(74) *Attorney, Agent, or Firm*—Oliff & Berridge PLC

(57) ABSTRACT

A pattern enlarged from a transfer pattern is divided into patterns (Pi) of a plurality of master reticles (Ri). Images of the patterns (Pi) of the plurality of master reticles (Ri) reduced by a projection optical system are successively-projected and exposed on the surface of a blank (mask substrate) while stitching. Marks (M1, M2) indicating identification information for identifying a master reticle from another master reticle, transfer positions, etc. are formed on the master reticles (Ri). These marks (M1, M2) are detected before the exposure and exposure is performed in accordance with the information on the transfer position etc. shown by the marks (M1, M2) or reticle information (exposure conditions, various correction values, etc.) relating to the master reticles stored and held in advance corresponding to the identification information. The number of work steps when producing a working reticle using the plurality of master reticles is reduced and occurrence of work errors can be prevented.

25 Claims, 13 Drawing Sheets

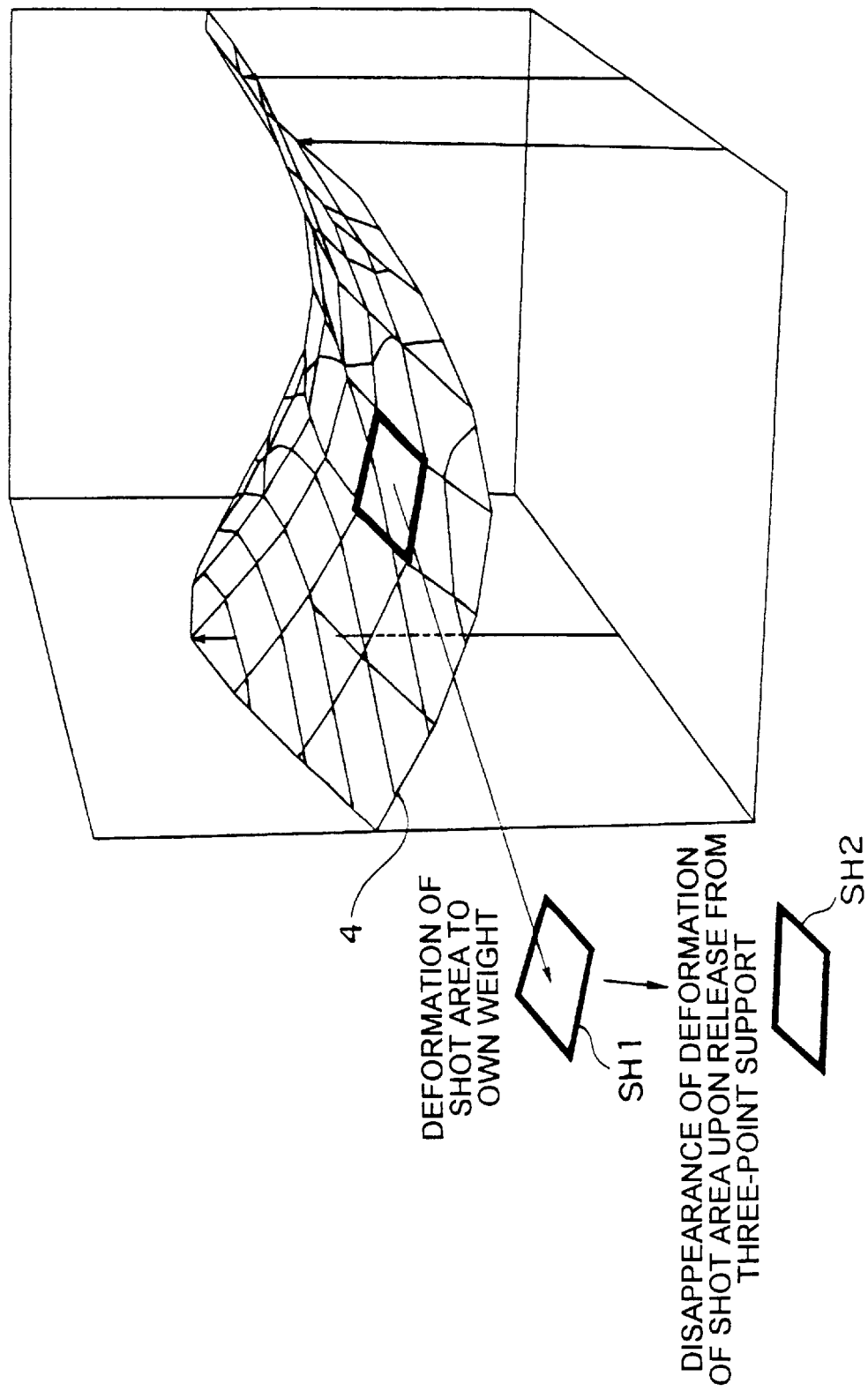

EXPOSURE METHOD AND EXPOSURE APPARATUS

TECHNICAL FIELD

The present invention relates to an exposure method used when producing a photomask used for producing a semiconductor integrated circuit, a liquid crystal display device, a thin film magnetic head, or another microdevice by photolithography and an exposure apparatus for working the exposure method.

BACKGROUND ART

In photolithography process of a semiconductor device, a pattern of a photomask is transferred on to a wafer or glass plate coated with a photoresist (hereinafter also called a "photosensitive substrate"). As this type of projection exposure apparatus, wide use has been used in the past of a step-and-repeat type exposure apparatus (stepper). This step-and-repeat type exposure apparatus exposes and transfers a pattern of a photomask by reduction projection on individual shot areas of the wafer. Therefore, when exposure of one shot area ends, the wafer is moved for exposure of the next shot area. This process is successively repeated.

Further, to increase the range of exposure of the mask pattern, a step-and-scan type exposure apparatus (scanning stepper) has been developed which synchronously moves the mask and wafer in scanning motion with the projection optical system in a state of restricting the exposure light from the illumination system into a slit shape (for example, rectangular shape) and projecting reduction image of a part of a mask pattern using the slit light. This step-and-scan type exposure apparatus (scanning stepper) has the advantages of an aligner transfer method of transferring the pattern of the entire surface of the mask to the entire surface of the wafer at an equal magnification by a single scan exposure and the advantages of the stepper transfer method. Note that a photomask used in a step-and-repeat type or step-and-scan type reduction projection type exposure apparatus is also called a "reticle".

The photomask used in such an exposure apparatus has conventionally been produced by drawing a master pattern on a photomask substrate using an electron beam lithography system or a laser beam lithography, system. That is, a mask material is formed on the substrate, a resist is coated on it, then the master pattern is drawn using an electron beam lithography system or laser beam lithography system. Next, the resist is developed and etched etc. to form the master pattern by the mask material. In this case, if the magnification rate of the reduction projection type exposure apparatus using this photomask is $1/\beta$, the master pattern drawn on the photomask may be the pattern of the device enlarged $\beta$-fold, therefore the drawing error due to the lithography system is reduced to about $1/\beta$ on the device. Therefore, it becomes possible to form the pattern of the device by a resolving power of about $1/\beta$ of the resolving power of the lithography system.

As explained above, in the past, the master pattern-of the photomask has been drawn by an electron beam lithography system or laser beam lithography system. These lithography systems draw master patterns directly based on the drawing data from a control computer. Recent LSIs and other devices, however, have become larger in size and improved in fineness and integration, so the master pattern of the photomask required for exposure also becomes larger in area and finer. Further, as the photomask, use is also made of a reticle for double exposure provided with a correction pattern for preventing transfer of unnecessary patterns, a so-called phase shift reticle provided with a phase shifter between adjoining patterns, etc. With these special photomasks, however, the amount of the drawing data tends to become greater than that of other photomasks. Due to this, the amount of drawing data required in an exposure apparatus for producing a photomask becomes massive.

Therefore, the drawing time required for drawing a master pattern of a photomask by such a lithography system has recently grown from 10 hours to around 24 hours. This increase in the drawing time is becoming a factor behind the rising cost of manufacture of a photomask.

In this regard, in an electron beam lithography system, it is necessary to correct the proximity effect caused by the back scattering distinctive to an electron beam. Further, it is necessary to correct the uneven electric field around the substrate due to the charging of the surface of the substrate. Therefore, to draw a master pattern as designed, it is necessary to measure the error of the drawing position etc. in advance under various conditions and make complicated corrections at a high accuracy and stability at the time of drawing. Making such complicated corrections during an extremely long drawing time such as the above with a high accuracy and stability on a continuous basis, however, is difficult. The disadvantage arises of drift of the drawing position during the drawing. Further, it is possible to suspend the drawing for calibration, but this has the disadvantage of the overall drawing time becoming even longer.

Further, the resolving power and other characteristics of the resist for electron beam use have not been improved that much. No rapid improvement in these characteristics is expected in the future as well. Therefore, if the pattern rule of semiconductor devices becomes finer in the future, the drawing time for the master pattern of a photomask is liable to become too long and the resolving power of the electron beam resist is liable to approach its limit making the required drawing accuracy impossible to obtain. Further, the amount of the drawing data in the control computer is also becoming massive to-the extent of difficulty for use in a single drawing operation.

A laser beam lithography system draws a master pattern using an ultraviolet band laser beam. There are the advantages that it is possible to use a resist giving a higher resolving power compared with an electron beam lithography system and that there is no proximity effect due to back scattering. The resolving power of a laser beam lithography system is inferior to that of an electron beam lithography system, however. Further, in a laser beam lithography system, since a master pattern is drawn directly in this system, the amount of drawing data becomes massive and data processing becomes difficult. Further, the drawing time becomes extremely long. Therefore, the required drawing accuracy is liable to not be able to be obtained due to drift of the drawing position etc.

To solve the above problem, the present assignee previously proposed an apparatus which enlarges the pattern for transfer, divides the pattern into a plurality of patterns of master masks, and successively projects and exposes images of the plurality of patterns of the mask patterns reduced by the projection optical system on the surface of the mask substrate (blank) while stitching them (hereinafter sometimes called a "reticle exposure apparatus" or a "mask exposure apparatus").

When producing a photomask used for the production of a microdevice (working mask) using a reticle exposure apparatus, a thin film of a mask material is formed on a mask substrate as the photomask substrate and a resist or other photosensitive material is coated on it. Next, reduced images of the plurality of patterns of master masks are transferred to the photosensitive material for example by an optical type reduction projection exposure apparatus by the step-and-repeat system or the step-and-scan system. By etching using the pattern of the remaining photosensitive material as a mask, a desired pattern for transfer (master pattern) is formed.

At this time, if the magnification rate of a for example optical type exposure apparatus for producing a photomask is made $1/\alpha$ (where a is an integer or fraction etc. larger than 1), the transfer pattern, that is, the master pattern, is enlarged $\alpha$-fold. This enlarged master pattern is divided into for example a x $\alpha$ number of patterns of master masks. If the magnification rate is $1/5$ ($\alpha=5$), $5\times5=25$ master masks are provided. As a result, since the patterns formed on the master masks are parts of the master pattern enlarged $\alpha$-fold from the master pattern, the amounts of the drawing data of the patterns of the master masks are reduced to about $1/\alpha^2$ of the past and the minimum line widths become $\alpha$-times the past. Therefore, the patterns of the master masks can be drawn in a short time with little drift and with a high accuracy using for example a conventional electron beam lithography system or laser beam lithography system. For example, since the drawing error of the lithography system is reduced to $1/\alpha$ on the photomask, the accuracy of the master pattern is further improved. Further, once these master masks are produced, the patterns of these master masks can be transferred at a high speed on to the substrate of the photomask by the step-and-repeat system etc., so the production time when producing a plurality of photomasks can be greatly reduced compared with the method of drawing individually by the lithography systems.

When there is an error in part of the patterns of the master masks at the time of formation or a change occurs in part of the master pattern after production, it is sufficient to correct or remake only the master masks including the part with the error or the master masks including the changed part. Since there is no effect on the plurality of master masks as a whole, it is possible to deal with these cases at a high efficiency.

When producing a working mask using a plurality of master masks, however, the plant producing the working mask stores a large number of master masks for dealing with all of the working masks to be produced. Therefore, when producing a working mask, the operator (worker) etc. has to set a plurality of master masks used in the production process (mask exposure apparatus) taking into consideration conditions such as at what position on the mask substrate (blank) of what layer of what product is being exposed. This work is extremely complicated resulting in easy occurrence of work errors.

Further, the various exposure conditions (exposure time, focus position, blind size, illumination conditions, shot XY magnification, etc.) differ for each master mask, so it is necessary to input and designate the respective exposure conditions or, when correcting the various error, input and designate the correction information for the same (correction values for deformation accompanying support of master mask, distortion of projection exposure apparatus, coma aberration, or other aberration, and deformation accompanying support of mask substrate etc.) The above problem was therefore extremely serious.

DISCLOSURE OF THE INVENTION

Therefore, an object of the present invention is to reduce the number of work steps and prevent the occurrence of work error when producing a photomask using a plurality of master masks.

Further, another object of the present invention is to produce a high accuracy photomask.

Note that in the following explanation, the present invention will be explained with reference to the reference numerals of members shown in the figures showing the embodiments, but the requirements of the present invention are not limited to the members given reference numerals and shown in the figure.

1. According to one aspect of the present invention, there is provided a method of dividing a pattern enlarged from a transfer pattern (27) into a plurality of patterns of master masks (Ri) and successively projecting and exposing images of the plurality of patterns (Pi) of master masks reduced by a projection optical system (3) on the surface of the mask substrate while stitching them, the method of exposure comprising steps of forming marks (M1, M2) including identification information for identifying one master mask from another master mask on each of the master masks, storing in advance mask information relating to the master masks corresponding to the identification information, detecting the mark of the master mask before exposure, and performing exposure in accordance with mask information corresponding to the identification information shown by the mark.

The master mask is formed with the mark including identification information for identifying the master mask from another master mask. The mark is detected before exposure and exposure is performed in accordance with mask information corresponding to the identification information shown by the mark, so by setting positional information showing the position on the mask substrate where the pattern of the master mask is to be transferred as the mask information, the operator etc. can simply extract the plurality of master masks required for production of a photomask and set them freely without identifying them in order to have the image of the pattern of the master mask transferred to the corresponding position on the mask substrate. Therefore, the operator etc. no longer has to set the masks considering conditions relating to the position such as for which position on the mask substrate the master mask is to be used for exposure, so the work becomes extremely easy and work errors become less frequent.

The mask information includes, in addition to the positional information showing the position on the mask substrate where the pattern of the master mask is to be transferred, for example correction information for canceling out deformation accompanying support of the master mask, aberration of the projection optical system, and deformation accompanying support of the mask substrate, the exposure time for the master mask, focus position, blind size, illumination conditions, shot magnification, and other exposure conditions, etc. Part or all of these may be included. By storing these correction information, exposure conditions, etc., intervention of an operator for the correction information or exposure conditions is no longer necessary, the number of work steps can be reduced, and input errors etc. are prevented. Further, even if the operator mistakenly sets different types of master masks, it is possible to identify this, so measures such as warnings can be devised and it is possible to eliminate the problem of exposure using master masks having no relation to the production of a working mask.

As the mark, it is possible to use a bar code mark or a spatial image measurement mark. When using a spatial image measurement mark, it is possible to use the mark for alignment of the master mask or correct various error based on the results of spatial image measurement. The mark may be detected in the state with the master mask held on the mask stage.

The above method forms a mark as identification information on the master mask. Corresponding mask information is stored in a storage device etc. This is particularly effective when there is a large amount of mask information. When the mask information is not that large, it is possible to directly form the mark including the mask information on the master mask. That is, it is possible to provide a method of dividing a pattern enlarged from a transfer pattern into a plurality of patterns of master masks and successively project and expose images of the plurality of patterns of master masks reduced by a projection optical system on to the surface of a mask substrate while stitching them where marks including mask information relating to the master masks are formed on each of the master masks and exposure is performed in accordance with the mask information shown by the marks.

An exposure apparatus of the present invention for working the above method of exposure provided with a plurality of master masks (Ri) formed with marks (M1) including positional information indicating a transfer position on a mask substrate (4) to be processed, a mask magazine (16) for storing the plurality of master masks, a mask stage (2) on which one master mask selected from the mask magazine is placed, a projection optical system (3) for projecting a reduced image of a pattern of the master mask on the mask stage on to a mask substrate, a substrate stage (6) for positioning the mask substrate on a plane vertical to an optical axis of the projection optical system, a detection device (56) for detecting content of the mark of the master mask on the mask stage, and a control device (9) for exposure in accordance with positional information shown by the mark detected by the detection device.

According to the exposure apparatus of the present invention, by forming the master mask with the mark including positional information showing the transfer position on the mask substrate where the pattern of the master mask is to be transferred, detecting the mark on the mask stage, and performing exposure at a position in accordance with the positional information shown by the mark, the operator etc. need only randomly load the plurality of master masks required for production of a photomask in the mask magazine in order to get the images of the patterns of the master masks transferred to the corresponding positions on the mask substrate. Therefore, the operator etc. no longer has to set the masks considering conditions relating to position such as for which positions on the mask substrate the master masks are to be used for exposure, so the work becomes extremely easy and work errors become less frequent.

2. According to another aspect of the present invention, there is provided a method of exposure for irradiating exposure light on a plurality of master masks (Ri) formed by dividing an enlarged pattern of a transfer pattern (27), reducing a pattern image of the same for each master mask, and transferring the same on to a mask substrate (4) on which the transfer pattern is to be formed, the method of exposure comprising steps of detecting deformation information (dxi, dyi) of the mask substrate corresponding to a transfer position of a pattern image and adjusting at least one of the relative positional relationship between the pattern image and the mask substrate at the time of transfer of the pattern image and the projection characteristics of the pattern image based on the deformation information. In this case, an exposure amount of said mask substrate can be changed in accordance with a change amount of a line width of the pattern image for every said master mask. Note that in the description and claims of the present application, "detecting deformation information" includes finding deformation information by actual measurement or finding it by simulation (calculation).

When successively projecting and exposing patterns while stitching them, since the positional accuracy or shape accuracy of the connecting parts of the patterns transferred by the master masks has a major effect on the quality or reliability of the photomask which is produced, it is extremely important that the positional or shape accuracy of the pattern be high. The mask substrate to be exposed is supported by a predetermined supporting method at the time of exposure, but flexing occurs due to the substrate's own weight in accordance with the support method. This flexing differs depending on the position (shot) on the mask substrate, so sometimes the pattern distorts, misalignment occurs at the stitched parts of the patterns, or other cases occur not allowing transfer of patterns with a high accuracy.

Therefore, the method of exposure of the present invention detects deformation information of the mask substrate and adjusts (deforms) the shape of a pattern image to be transferred in accordance with the flexing or other deformation of the mask substrate for transfer. That is, the shape of the projected image on the surface is adjusted to the desired shape in the state with the mask substrate deformed in this way. Due to this, it is possible to produce a high quality, high reliability photomask. As the deformation information, for example, it is possible to employ as a standard the information in the case of supporting the mask substrate theoretically flat. By making adjustment based on this deformation information, it is possible to form a pattern having a pattern shape close to the ideal pattern shape in the state with the photomask produced supported ideally flat. The deformation information, however, is not limited to the standard of the ideal shape. It is also possible to use deformation information based on the state supported on the mask stage etc. of the device exposure apparatus (exposure apparatus for producing microdevices) at which the produced photomask is used. By making adjustment based on this, it is possible to form a pattern having the desired pattern shape in the state supported on the mask stage etc. of the device exposure apparatus.

Further, it is possible to detect the identification information formed on the master mask to obtain deformation information of the mask substrate. By doing this, input of the deformation information becomes unnecessary, the number of work steps can be reduced, and occurrence of defective products due to input error etc. can be prevented. Further, it is possible to support the mask substrate at a plurality of points without chucking. As the deformation information, it is possible to use information including information relating to flexing of the mask substrate due to its own weight.

Note that when adjusting the relative positional relationship between the pattern image and the mask substrate at the time of transfer of the pattern image, it is possible to make adjustments by for example shifting or rotating the position of the master mask and/or mask substrate, shift the stepping position, change the scan speed, change the scan direction, etc. Alternatively, it is possible to adjust the optical characteristics by adjusting the projection characteristics of the pattern image, for example, the lens controller of the projection optical system projecting the pattern image.

An exposure apparatus of the present invention for working the above method of exposure is an exposure apparatus provided with an illumination optical system (1) for irradiating illumination light to a plurality of master masks (Ri) formed by dividing an enlarged pattern of a transfer pattern (27) and a projection optical system (3) for reducing a pattern image for each master mask and projecting it on a mask substrate (4) on which the transfer pattern is to be formed, further comprising a detection device (56) for detecting information on deformation of the mask substrate in accordance with a transfer position of the pattern image and an adjustment device for adjusting at least one of a relative positional relationship between the pattern image and the mask substrate and projection characteristics of the pattern image at the time of transfer of the pattern image based on the deformation information. In this case, it is possible to further provide a stage for supporting the substrate at a plurality of points without chucking.

According to the exposure apparatus of the present invention, since the shape of the pattern image on the mask substrate is adjusted (deformed) for transfer, when projecting and exposing the patterns of the plurality of masks successively on the substrate while stitching them, it is possible to improve the continuity (continuity in the case of connection in the direction along the lines in the case of for example line-and-space (L/S) patterns) and periodicity (periodicity of arrangement in the direction orthogonal to the lines in the case of for example L/S patterns) of the connecting parts of the patterns formed using one master mask and another pattern formed using another adjoining master mask. Due to this, it is possible to produce a high quality, high reliability photomask.

3. According to another aspect of the present invention, there is provided a method for transfer of a pattern on to a substrate by exposing the substrate by illumination light through a mask formed with the pattern, comprising supporting the substrate at a plurality of points without chucking and adjusting at least one of a relative positional relationship between the pattern and the substrate and transfer conditions of the pattern at the time of transfer of the pattern based on information relating to flexing of the substrate by its own weight corresponding to the transfer position of the pattern on the substrate. In this case; it is possible to employ, as transfer conditions of the pattern, imaging characteristics of the projection optical system for forming a projected image of the pattern on the substrate. Also, said pattern is divided to more than one to be formed as a different mask and an exposure amount of said substrate can be changed in accordance with a change amount of a line width of said pattern image when transferring the pattern image on said substrate for every said mask. In this case, said substrate becomes a working mask to be used in an exposure apparatus for device production and an optical type reduction projection exposure apparatus can be used for transferring said pattern image.

The exposure apparatus of the present invention for working the above method of exposure is an apparatus for transferring a pattern to a substrate by exposing the substrate by illumination light through a mask formed with the pattern, provided with a stage for supporting the substrate at a plurality of points without chucking and an adjustment device for adjusting at least one of a relative positional relationship between the pattern and the substrate and transfer conditions of the pattern at the time of transfer of the pattern based on information relating to flexing of the substrate by its own weight corresponding to the transfer position of the pattern on the substrate.

4. According to still another aspect of the present invention, there is provided an exposure method for irradiating illumination light on each of a plurality of masks and transferring the pattern image on a photosensitive layer on a substrate for every said mask, wherein an exposure amount of said photosensitive layer can be changed in accordance with a change amount of a line width of said transferred pattern image at the time of transferring said pattern image at a part of said plurality of masks. In this case, said substrate becomes a working mask to be used in an exposure apparatus for device production and an optical type reduction projection exposure apparatus can be used for transferring said pattern image.

BRIEF DESCRIPTION OF THE DRAWINGS

FIG. 12 is a view schematically showing the flexing accompanying support of a blank in an embodiment of the present invention;

BEST MODE FOR WORKING THE INVENTION

The present invention will be explained in further detail below with reference to the attached drawings.

Figure 1:
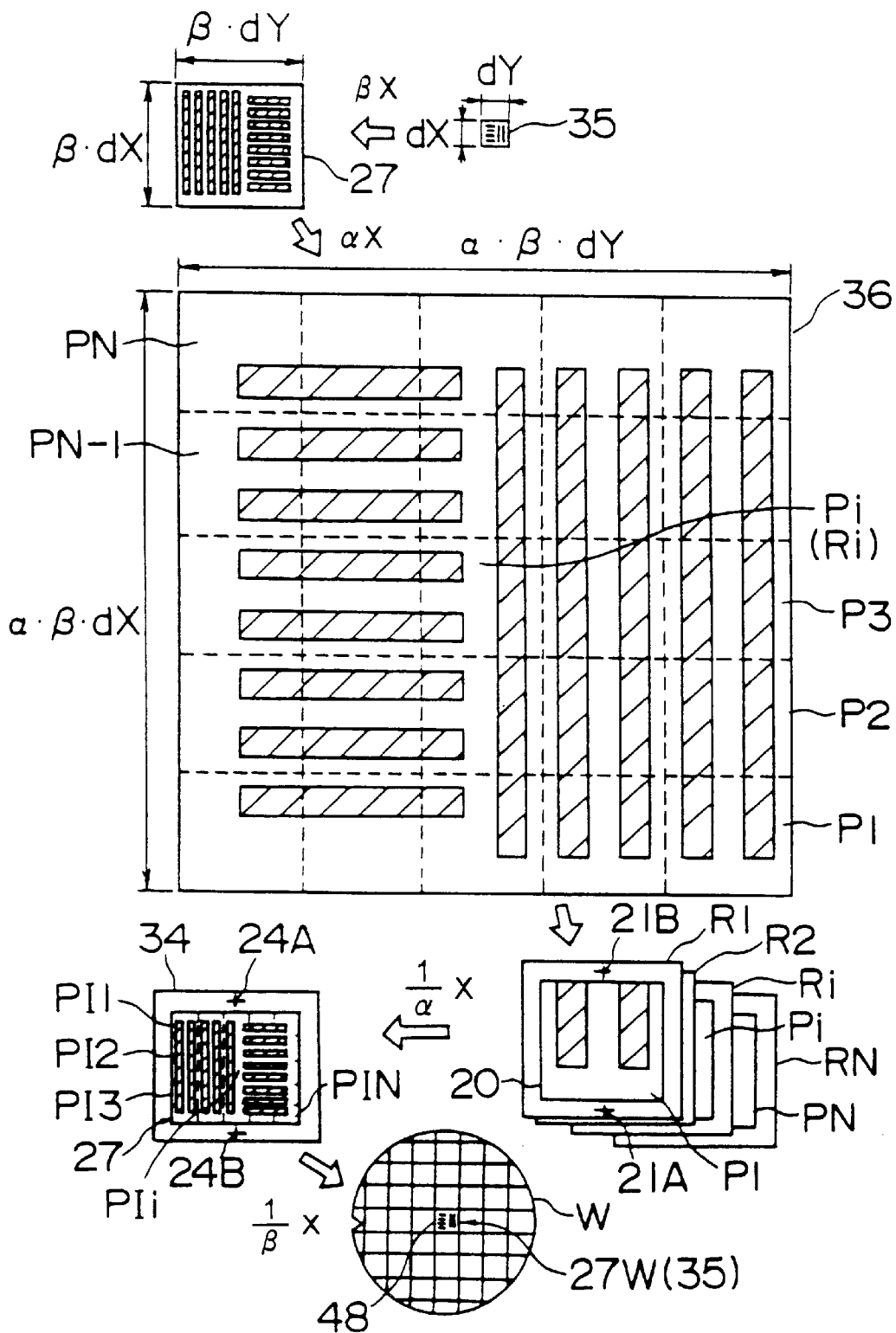
FIG. 1 is a view provided for explaining the process of production of a working reticle (photomask) of an embodiment of the present invention.

FIG. 1 is a view of the process of production of a photomask of this example. In FIG. 1, the mask to be produced in this example is a working reticle 34 used when producing a semiconductor device. This working reticle 34 comprises a light transmitting substrate made of silica glass etc. on one surface of which is formed a master pattern 27 for transfer from chrome (Cr), molybdenum silicide (MoSi$_2$ etc.), or another mask material. Further, two alignment marks 24A and 24B are formed so as to straddle this master pattern 27.

Further, the working reticle 34 is used in reduction projection of 1/β (where β is an integer or fraction larger than 1, for example, 4, 5, or 6) through a projection optical system of an optical type projection exposure apparatus. That is, in FIG. 1, a 1/β reduced image 27W of the master pattern 27 of the working reticle 34 is exposed on each shot area 48 on a wafer W coated with a photoresist, then developed and etched so as to form a predetermined circuit patter 35 on each shot area 48. Below, the explanation will be given of an example of a method of production of a working reticle 34 as the photomask of this example.

In FIG. 1, first, a circuit pattern 35 of a certain layer of the semiconductor device to be finally produced is designed. The circuit pattern 35 forms various line-and-space patterns (or isolated patterns) in a rectangular area with widths of perpendicularly intersecting sides of dX and dY. In this example, the circuit pattern 35 is enlarged β-fold and the master pattern 27 comprised of a rectangular area of widths of perpendicular sides of β·dx and β·dY is formed in the image data of a computer. The β is the reciprocal of the reduction magnification (1/β) of the projection exposure apparatus in which the working reticle 34 is used. Further, when inversely projected, the image is enlarged inverted.

Next, the master pattern 27 is enlarged α-fold (α is an integer or fraction larger than 1, for example, 4, 5, 6, etc.) and a master pattern 36 comprised of a rectangular area with widths of perpendicular sides of α·β·dx and α·β·dY is prepared on the image data. The master pattern 36 is divided into a number of sections in the vertical and horizontal directions to prepare a x α number of master patterns P1, P2, P3 . . . PN (N=α$^2$) on the image data. In FIG. 1, the case where α=5 is shown. Note that the divisor a of the master pattern 36 does not necessarily have to match with the magnification a from the master pattern 27 to the master pattern 36. Next, the drawing data for the electron beam lithography system (a laser beam lithography system etc. also may be used) is created by the master patterns Pi (i=1 to N). The master patterns Pi are transferred on the master reticles Ri used as the master mask by equal magnification.

For example, when producing one master reticle R1, a thin film of chrome or molybdenum silicide or another mask material is formed on a light transmitting substrate of silica glass etc., an electron beam resist is coated on this, then an electron beam lithography system is used for drawing an equal magnification image of the first master pattern P1 on the electron beam resist. Next, the electron beam resist is developed, then etched and the resist peeled off to form the master pattern P1 on the pattern area 20 on the master reticle R1. At this time, alignment marks 21A and 21B comprised of two 2-dimensional marks are formed at predetermined positional relationships with respect to the master pattern P1 on the master reticle R1. Similarly, the master patterns Pi and alignment marks 21A and 21B are formed using an electron beam lithography system etc. on other master reticles Ri. These alignment marks 21A and 21B are used for positioning at the time of the later stitching. Further, while explained in detail later, a plurality of marks (marks for spatial image measurement, reticle identification, etc.) are formed in the peripheral area (light blocking area outside of the pattern area formed with the pattern) of the master reticles Ri.

In this way, in this example, since the master patterns Pi drawn by the electron beam lithography system (or laser beam lithography system) are patterns enlarged α-fold from the master pattern 27, the amount of the drawing data is reduced to about 1/α$^2$ of the case of direct drawing of the master pattern 27. Further, the minimum line width of the master patterns, Pi is α-times (for example, 5 times or 4 times etc.) the minimum line width of the master pattern 27, so the master patterns Pi can be drawn in a short time and at a high accuracy by an electron beam lithography system using a conventional electron beam resist. Further, once producing N number of master reticles R1 to RN, they can be repeatedly used as later explained to produce the necessary number of working reticles 34, so the time for producing the master reticles R1 to RN does not become a large burden.

That is, the working reticle 34 is produced by transferring the 1/α reduced images PIi (i=1 to N) of the master patterns Pi of the N number of master reticles Ri while stitching them. Note that it is also possible not to divide the master pattern 36 into a matrix like plurality of master patterns Pi as shown in FIG. 1, but for example to divide it for example for each functional block (CPU, DRAM, A/D converter, D/A converter, etc.) This is effective for producing a working reticle for a system LSI. That is, even with system LSIs of different applications or performance, parts of the circuit are designed in common. It is possible to apply master patterns (master reticles) corresponding to these common circuits to the production of the different system LSIs and therefore reduce the total number of master reticles.

Figure 2:
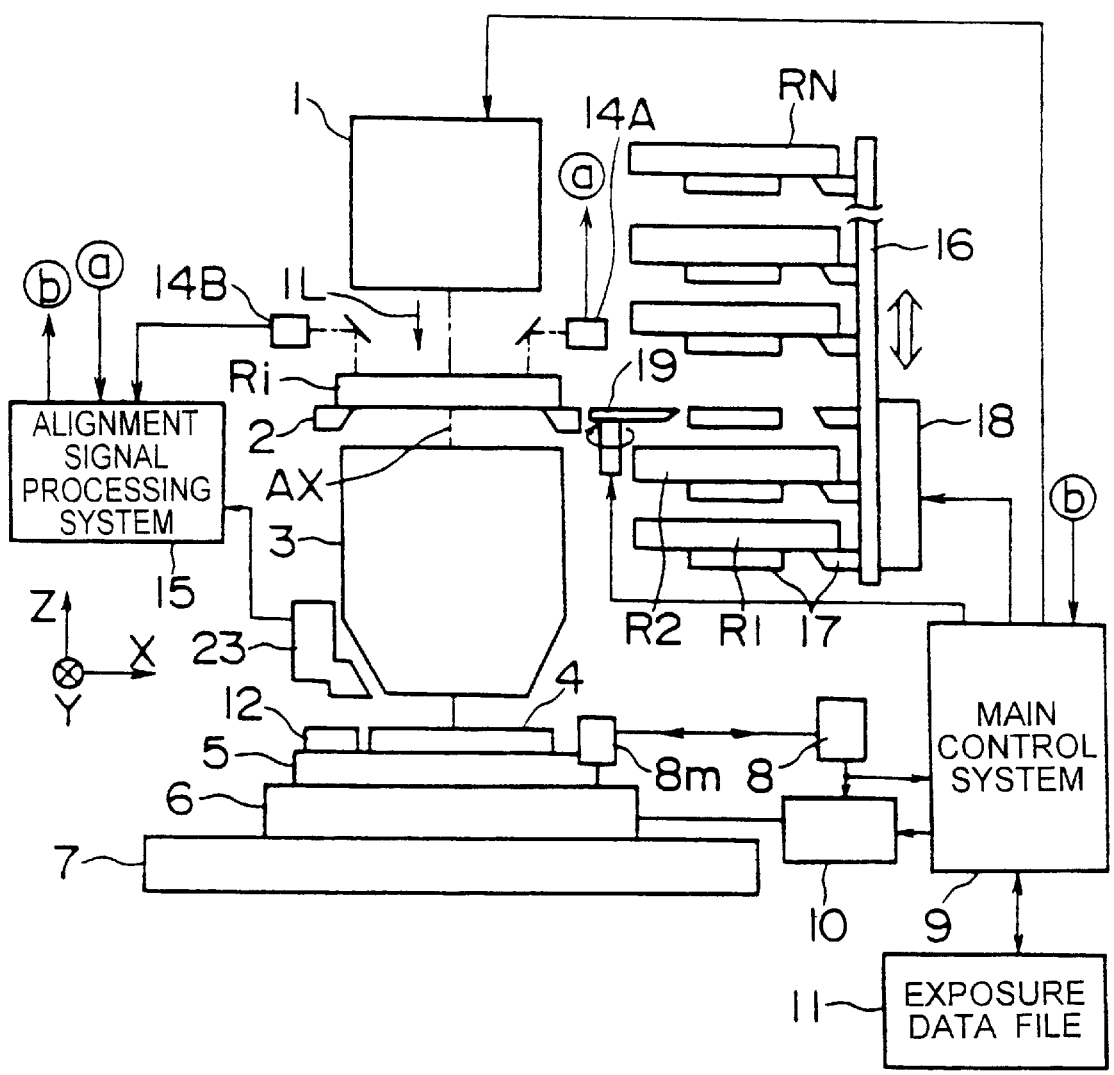
FIG. 2 is a view of the overall configuration of an optical type reduction projection exposure apparatus used when producing a working reticle of an embodiment of the present invention.

FIG. 2 shows a reduction projection exposure apparatus used when producing a working reticle 34. In FIG. 2, at the time of exposure, illumination light IL is irradiated on the reticle on the reticle stage 2 from an illumination system 1 comprised of an exposure light source, a fly-eye lens or rod integrator or other optical integrator (homogenizer) for achieving a uniform luminance distribution, an illumination system aperture stop, a reticle blind (variable field stop), a condenser lens, etc. The i-th (i=1 to N) master reticle Ri is placed on the reticle stage 2 of this example. Note that as the exposure light, i-rays (wavelength 365 nm) of a mercury lamp or other emission line, KrF excimer laser light (wavelength 248 nm), ArF excimer laser light (wavelength 193 nm), F$_2$ laser light (wavelength 157 nm), etc. may be used.

The image of the pattern in the illuminated area of the master reticle Ri is projected on the surface of the substrate (blank) 4 for the working reticle 34 by a reduction magnification 1/α (α is for example 5, 4, etc.) through the projection optical system 3. The substrate 4 is a light transmitting substrate such as silica glass. A thin film of chrome, molybdenum silicide, or other mask material is formed on the pattern area 25 of the surface (see FIG. 4). Alignment marks 24A and 24B comprised of two 2-dimensional marks for positioning are formed so as to straddle the pattern area 25. These alignment marks 24A and 24B are formed in advance before transfer of the master pattern using an electron beam lithography system, laser beam lithography system, projection exposure apparatus (stepper, scanner), etc. Further, a photoresist is coated on the surface of the substrate 4 so as to cover the mask material. Below, the explanation will be made with reference to a Z-axis taken parallel to the optical axis AX of the projection optical system 3, to an X-axis in the plane perpendicular to the Z-axis and parallel to the paper surface of FIG. 2, and to a Y-axis perpendicular to the paper surface of FIG. 2.

First, the reticle stage 2 positions the master reticle Ri on it in the XY plane. The position and rotational angles (amounts of rotation about the X-axis, Y-axis, and Z-axis) of the reticle stage 2 are measured by a not shown laser interferometer and the operation of the reticle stage 2 is controlled by the measured values and the control information from the main control system 9. On the other hand, the substrate 4 is supported by vacuum chucking or supported at three points on a not shown substrate holder, the substrate holder is fixed on the sample table 5, and the sample table 5 is fixed on the XY stage 6. The sample table 5 brings the surface of the substrate 4 in register with the image plane of the projection optical system 3 by controlling the focus position (position in optical axis AX direction) and tilt angle of the substrate 4 by the auto focus system. Further, the XY stage 6 is driven on the base 7 by for example a linear motor and positions the sample table 5 (substrate 4) in the X-direction and Y-direction.

Figure 3:
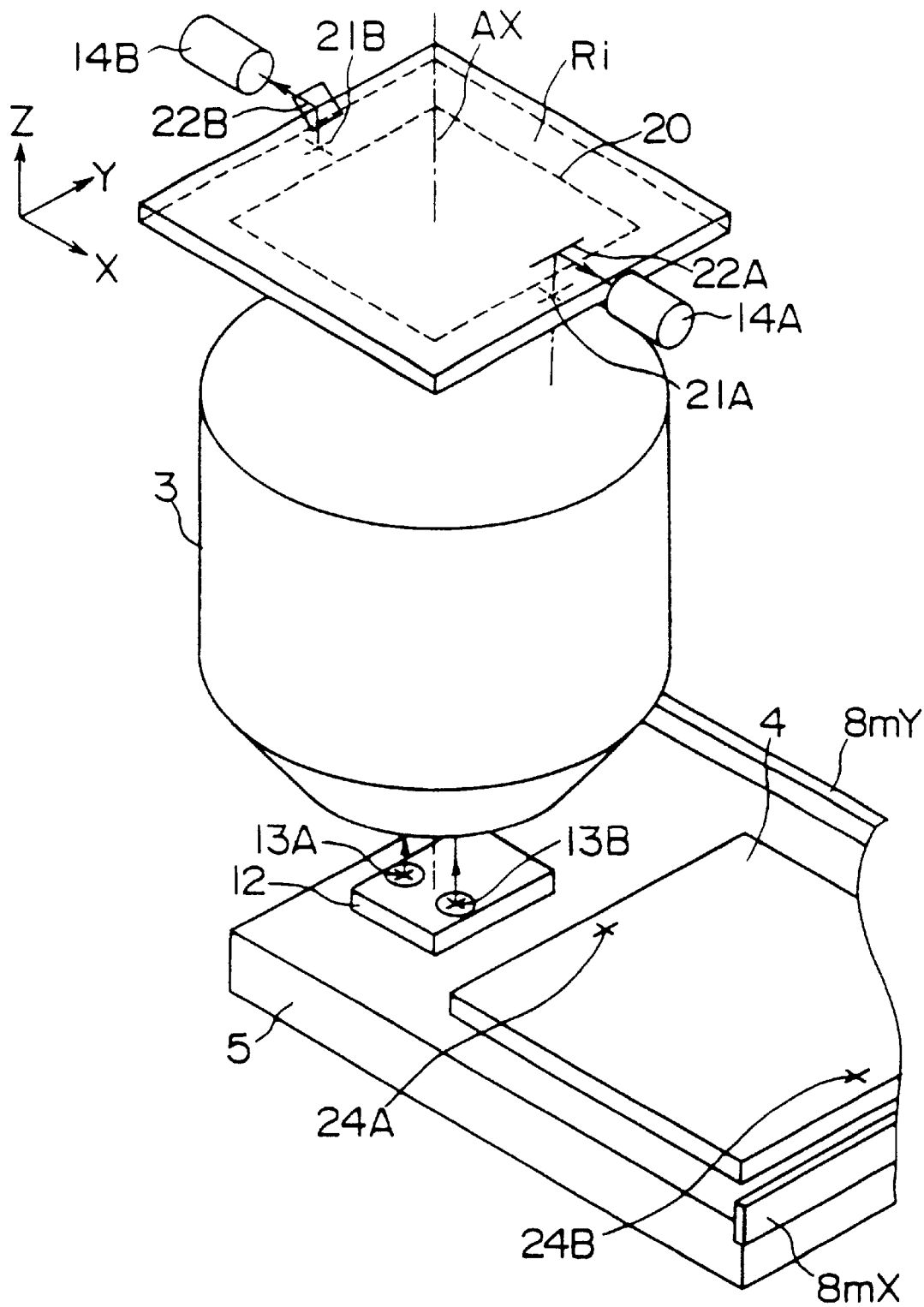
FIG. 3 is a perspective view of key parts in the case of alignment of a master reticle of an embodiment of the present invention.

The X-coordinate, Y-coordinate, and rotational angles (amounts of rotation about the X-axis, Y-axis, and Z-axis) are measured by a moving mirror 8m fixed above the sample table 5 and a laser interferometer 8 arranged facing it. The measured values are supplied to the stage control system 10 and main control system 9. The moving mirror 8m, as shown in FIG. 3, is a general name for the X-axis moving mirror 8mX and Y-axis moving mirror gmY. The stage control system 10 controls the operation of the linear motor of the XY stage 6 etc. based on the measured values and the control information from the main control system 9.

Further, in the present example, a shelf-like reticle library (mask magazine) 16 is arranged at the side of the reticle stage 2. Master reticles R1, R2, . . . , RN are carried on the N number of support shelves 17 successively arranged in the Z-direction in the reticle library 16. These master reticles R1 to RN are reticles (master masks) formed with master patterns P1 to PN obtained by dividing the master pattern 36 of FIG. 1. The reticle library 16 is supported movably in the Z-direction by a slider 18. A reticle loader 19 able to freely rotate and provided with an arm able to move in a predetermined range in the Z-direction is arranged between the reticle stage 2 and the reticle library 16. The main control system 9 adjusts the position of the reticle library 16 in the Z-direction through the slider 18, then controls the operation of the reticle loader 19 to enable transfer of desired master reticles R1 to RN between the desired support shelves 17 of the reticle library 16 and the reticle stage 2. In FIG. 2, the i-th master reticle Ri in the reticle library 16 is placed on the reticle stage 2.

Further, a magnetic disk drive or other storage device 11 is connected to the main control system 9. An exposure data file is stored in the storage device 11. The exposure data file stores identification information (ID information etc.) given to the master reticles R1 to RN used for production for each working reticle and reticle information relating to the master reticle corresponding to the identification information (exposure conditions, various correction values, etc.)

At the time of exposure of the substrate 4 of this example, when exposure of a reduced image of a master reticle (for example, R1) having a master pattern to be transferred to one shot area on the substrate 4 on that shot area is finished, the master reticle R1 on the reticle stage 2 is returned to the reticle library 16 through the reticle loader 19, then the next master reticle to be transferred (for example R2) is placed from the reticle library 16 through the reticle loader 19 on the reticle stage 2. In this state, the later mentioned alignment, detection of the identification marks etc., correction of the imaging characteristics, etc. are performed and the shot area on the substrate to which the master reticle R2 is to be transferred is moved to the exposure area of the projection optical system 3 by step movement of the XY stage 6. Next, a reduced image of the master reticle R2 is projected and exposed on the shot area on the substrate 4 through the projection optical system 3, then reduced images of the corresponding master reticles R2 to RN are successively exposed on the remaining shot areas on the substrate 4 by the step-and-repeat system.

When exposing reduced images of the master reticles R1 to RN on the substrate 4 in this way, it is necessary to stitch adjoining reduced images at a high accuracy. Therefore, the master reticles Ri (i=1 to N) and the corresponding shot areas (Si) on the substrate have to be aligned at a high accuracy. For this alignment, a reticle and substrate alignment mechanism is provided at the projection exposure apparatus of this example.

FIG. 3 shows the reticle alignment mechanism of this example. In FIG. 3, a light transmitting; fiducial mark member 12 is affixed near the substrate 4 on the sample table 5. Two cross-shaped fiducial marks 13A and 13B are for example formed at a predetermined interval in the X-direction on the fiducial mark member 12. At the bottoms of the fiducial marks 13A and 13B is placed an illumination system for illuminating the fiducial marks 13A and 13B at the projection optical system 3 side by illumination light branched from the exposure light IL. When aligning a master reticle Ri, the substrate stage 6 of FIG. 3 is driven to position the fiducial marks 13A and 13B so that the center point between the fiducial marks 13A and 13B on the fiducial mark member 12 substantially registers with the optical axis AX of the projection optical system 3 as shown in FIG. 3.

Further, for example, two cross-shaped alignment marks 21A and 21B are formed so as to straddle the pattern area 20 of the pattern surface (bottom surface) of the master reticle Ri in the X-direction. The distance between the fiducial marks 13A and 13B is set to be substantially equal to the distance between images of the alignment marks 21A and 21B reduced by, the projection optical system 3. By illumination by illumination light of the same wavelength as the exposure light IL from the bottom of the fiducial mark member 12 in the state with the center point between the fiducial marks 13A and 13B substantially in register with the optical axis AX in the above way, images of the fiducial marks 13A and 13B enlarged by the projection optical system 3 are formed near the alignment marks 21A and 21B of the master reticle Ri.

Mirrors 22A and 22B are arranged above the alignment marks 21A and 21B to reflect the illumination light from the projection optical system 3 side in the ±X directions. Image processing type alignment sensors 14A and 14B are provided by a TTR (through-the-reticle) system so as to receive the illumination light reflected by the mirrors 22A and 22B. The alignment sensors 14A and 14B are each provided with an imaging system and a 2-dimensional image pickup element such as a CCD camera. The image pickup elements pick up the images of the alignment marks 21A and 21B and the corresponding fiducial marks 13A and 13B and supply image signals to an alignment signal processing system 15 of FIG. 2.

The alignment signal processing system 15 processes the image signals to find the amount of positional deviation of the alignment marks 21A and 21B in the X-direction and Y-direction with respect to the fiducial marks 13A and 13B and supplies the two positional deviations to the main control system 9. The main control system 9 positions the reticle stage 2 so that the two positional deviations become symmetrical and within predetermined ranges. Due to this, the alignment marks 21A and 21B and in turn the master pattern Pi in the pattern area 20 of the master reticle Ri (see FIG. 1) are positioned with respect to the fiducial marks 13A and 13B.

In other words, the center (exposure center) of the reduced image of the master pattern Pi of the master reticle Ri obtained by the projection optical system 3 is positioned at the center point between the fiducial marks 13A and 13B (substantially the optical axis AX) and the perpendicularly intersecting sides of the contour of the master pattern Pi (contour of pattern area 20) are set to be parallel to the X-axis and Y-axis. In this state, the main control system 9 of FIG. 2 stores the X-direction and Y-direction coordinates $(XF_0, YF_0)$ of the sample table 5 measured by the laser interferometers 8, whereby the alignment operation of the master reticle Ri ends. After this, it is possible to move any point on the sample table 5 to the exposure center of the master pattern Pi.

Further, as shown in FIG. 2, an image processing type alignment sensor 23 is provided by an off-axis system at the side of the projection optical system 3 to detect the position of a mark on the substrate 4. The alignment sensor 23 illuminates a detection mark by illumination light of a wide band to which the photoresist is not sensitive, picks up the image of the detection mark by a 2-dimensional image pickup element such as a CCD camera, and supplies an image signal to the alignment signal processing system 15. Further, the distance (base line amount) between the detection center of the alignment center 23 and the center of the projected image of the pattern of the master reticle Ri (exposure center) is found in advance using a predetermined fiducial mark on the fiducial mark member 12 and stored in the main control system 9.

As shown in FIG. 3, two cross-shaped alignment marks 24A and 24B are formed at the ends of the substrate 4 in the X-direction. After the master reticle Ri is aligned, the XY stage 6 is driven to successively move the fiducial marks 13A and 13B and the alignment marks 24A and 24B on the substrate 4 to the detection area of the alignment sensor 23 of FIG. 3 and measure the positional deviations of the fiducial marks 13A and 13B and the alignment marks 24A and 24B with respect to the detection center of the alignment sensor 23. The results of the measurements are supplied to the main control system 9. Using these measurement results, the main control system 9 finds the coordinates $(XP_0, YP_0)$ of the sample table 5 when the center point between the fiducial marks 13A and 13B is in register with the detection center of the alignment sensor 23 and the coordinates $(XP_1, YP_1)$ of the sample table 5 when the center point between the alignment marks 24A and 24B is in register with the detection sensor of the alignment sensor 23. This ends the alignment operation of the substrate 4.

Figure 4:
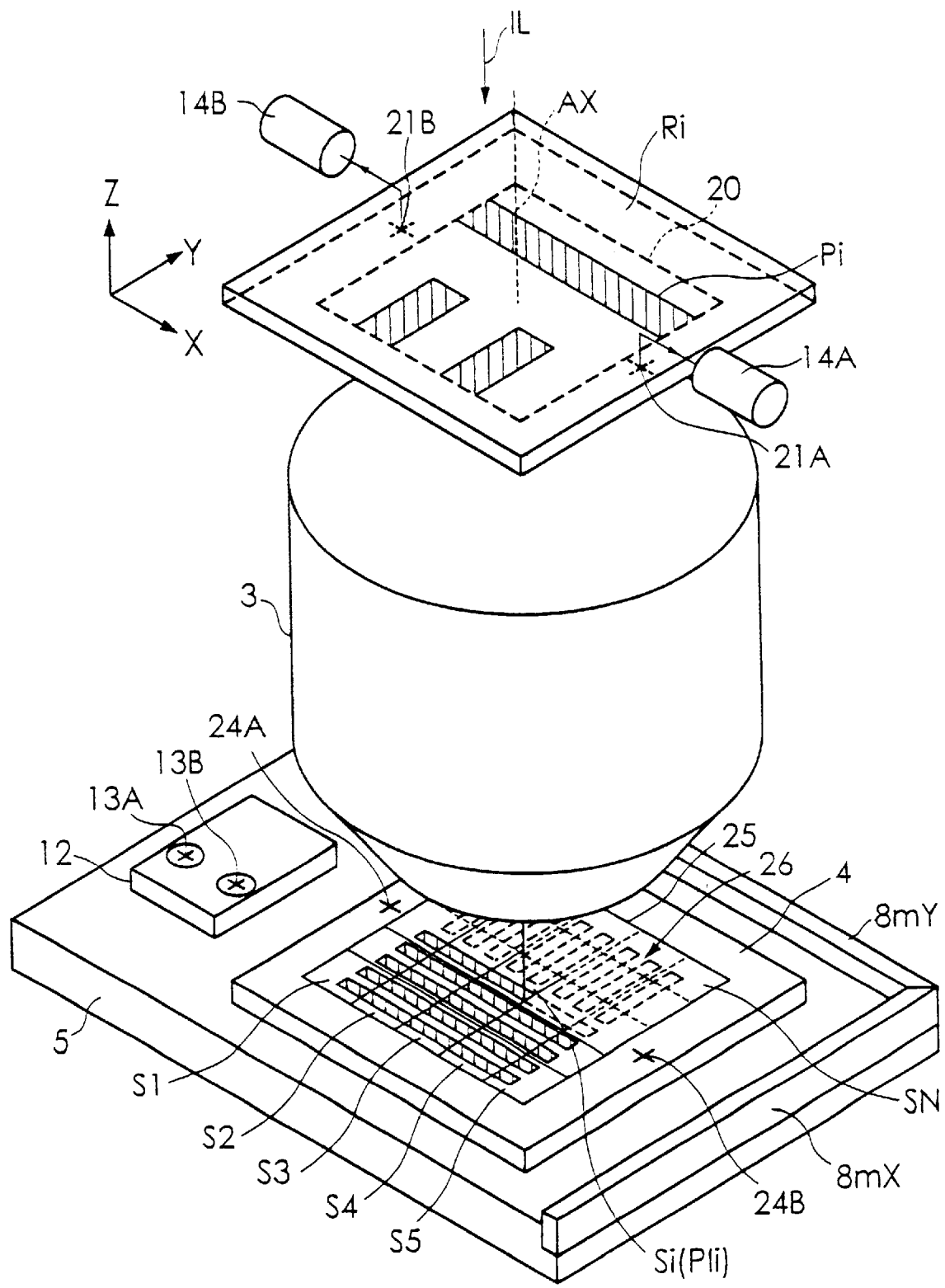
FIG. 4 is a perspective view of key parts in the case of projecting on to a substrate a reduced image of a master pattern of a master reticle of an embodiment of the present invention.

As a result, the distances between the center point between the fiducial marks 13A and 13B and the center point between the alignment marks 24A and 24B in the X-direction and the Y-direction become $(XP_0-XP_1, YP_0-YP_1)$. Therefore, by driving the substrate stage 6 of FIG. 2 by exactly the distances $(XP_0-XP_1, YP_0-YP_1)$ with respect to the coordinates $(XF_0, YF_0)$ of the sample table 5 at the time of alignment of the master reticle Ri, it is possible to bring the center point between the alignment marks 24A and 24B of the substrate 4 (center of substrate 4) into register with the center point between the projected images of the alignment marks 21A and 21B of the master reticle Ri (exposure center) with a high accuracy as shown in FIG. 4. From this state, the XY stage 6 of FIG. 2 may be driven to move the sample table 5 in the X-direction and the Y-direction so as to expose a reduced image PIi of a master pattern Pi of the master reticle Ri at a desired position with respect to the center of the substrate 4.

That is, FIG. 4 shows the state where a master pattern Pi of an i-th master reticle Ri is reduced and transferred on to the substrate 4 through the projection optical system 3. In FIG. 4, a rectangular pattern area 25 surrounded by sides parallel to the X-axis and Y-axis is virtually set in the main control system 9 centered on the center point between the alignment marks 24A and 24B of the surface of the substrate 4. The size of the pattern area 25 is the size of the master pattern 36 of FIG. 1 reduced to $1/\alpha$. The pattern area 25 is partitioned equally into a sections in the X-direction and the Y-direction to virtually set shot areas S1, S2, S3, ..., SN ($N=\alpha^2$). The position of a shot area Si (i=1 to N) is set to the position of a reduced image PIi of the i-th master pattern Pi when assuming reducing and projecting the master pattern 36 of FIG. 1 through the projection optical system 3 of FIG. 4.

Further, when the imaging characteristics of the projected image of the projection exposure apparatus using the working reticle 34 of the present example are ideal, the main control system 9 drives the XY stage 6 of FIG. 2 so as to bring the center of the i-th shot area Si on the substrate 4 in FIG. 4 into register with the exposure center of the reduced image PIi of the master pattern Pi of the master reticle Ri found by the above alignment. Next, the main control system 9 performs processing for correcting the imaging characteristics explained later, then projects and exposes the reduced image of the master pattern Pi on the shot area Si of the substrate 4. In FIG. 4, the reduced image of a master pattern already exposed in the pattern area 25 of the substrate 4 is shown by a solid line, while an unexposed reduced image is shown by a broken line.

Figure 5:
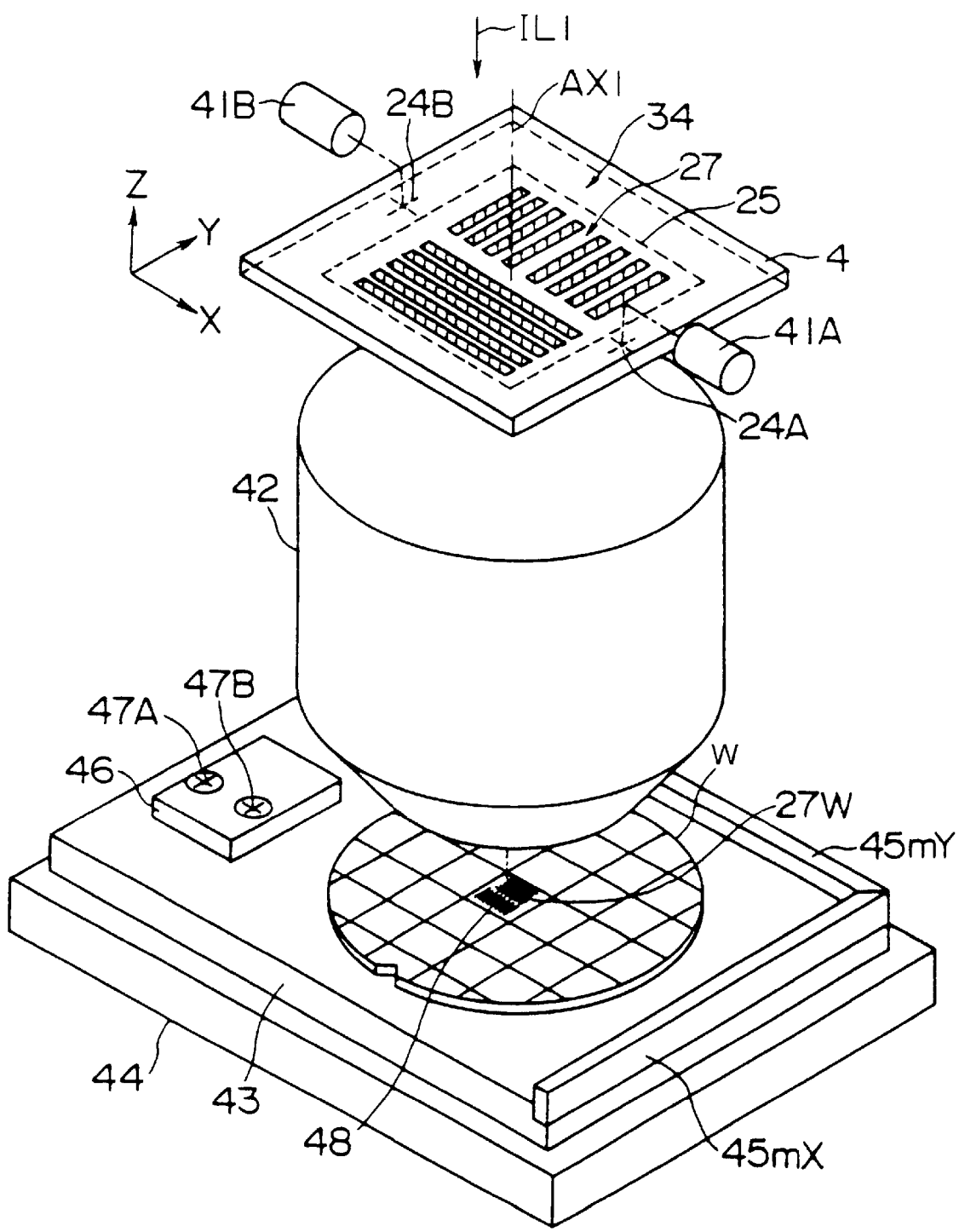
FIG. 5 is a perspective view of key parts of a projection exposure apparatus for projecting on to a wafer a pattern of a working reticle produced in an embodiment of the present invention.

In this way, by successively exposing the reduced images of the master patterns P1 to PN of the N number of master reticles R1 to RN of FIG. 2 on the corresponding shot areas Si to SN on the substrate 4, the reduced images of the master patterns P1 to PN are exposed while being stitched with the reduced images of the adjoining master patterns. Due to this, a projected image 26 reduced $1/\alpha$ from the master pattern 36 of FIG. 1 is exposed. Next, the photoresist on the substrate 4 is developed and etched and the remaining resist pattern is peeled off, whereby the projected image 26 on the substrate becomes the master pattern 27 as shown in FIG. 5 and the working reticle 34 is completed.

When exposing one substrate 4, regardless of the exchange of a master reticle Ri, the substrate 4 is fixed to the sample table 5. This position is measured accurately by the laser interferometer 8. Therefore, during exposure of one substrate 4, the positional relationship between the fiducial marks 13A and 13b and the substrate 4 will not change, so at the time of exchange of the master reticle Ri, it is sufficient to position the master reticle Ri with respect to the fiducial marks 13A and 13B. It is not necessarily required to detect the positions of the alignment marks 24A and 24B on the substrate 4 for each master reticle. In this case as well, the master patterns Pi on the master reticles Ri are exposed while maintaining an accurate positional relationship by positioning of the fiducial marks 13A and 13B and positional control of the XY stage 6 by the stage control system 10 monitored by the laser interferometer. Therefore, the stitching accuracy among patterns of course also becomes a high accuracy.

Further, when for example dense patterns and isolated patterns are formed on the master pattern 27 of FIG. 1, only the dense patterns are formed on the first master reticle Ra among the master reticles R1 to RN, while only isolated patterns are formed at another master reticle Rb. At this time, the best illumination conditions, imaging conditions, and other exposure conditions differ between the dense patterns and the isolated patterns, so it is also possible to optimize the exposure conditions, that is, the shape and size of the aperture stop in the illumination system 1, the coherence factor (σ value), the numerical aperture of the projection optical system 3, etc. in accordance with the master pattern Pi for each exposure of the master reticle Ri. At this time, when the master pattern Pi is a dense pattern (periodic pattern), it is sufficient to employ the deformation illumination method and limit the shape of the secondary light source to a annular shape or a plurality of local areas substantially equal distances away from the optical axis of the illumination system. Further, to optimize the exposure conditions, it is also possible to attach an optical filter (so-called pupil filter) blocking exposure light in a circular area centered about the optical axis near the pupil plane of the projection optical system 3 and/or jointly use the so-called cumulative focus method (flex method) causing relative vibration in a predetermined range between the image plane of the projection optical system 3 and substrate 4. Whether or not to apply techniques for optimizing the exposure conditions or the parameters etc. for the same are set for each master reticle Ri as reticle information in the exposure data file of the storage device 11. At the time of exposure, optimization is performed in accordance with the reticle information corresponding to the master reticle Ri of the exposure data file.

Note that it is also possible to use the master mask as a phase shift mask and make the σ-value of the illumination system for example 0.1 to 0.4 or, if necessary, to jointly use the above cumulative focus method or employ it alone. Further, the photomask (working reticle) is not limited to a mask comprised of only a chrome or other light blocking layer. It may also be a phase shift mask of for example the spatial frequency modulation type (Shibuya-Levenson type), edge emphasizing type, and halftone type. In particular, in the spatial frequency modulation type or edge emphasizing type, a master mask for a phase shifter is separately prepared for patterning a phase shifter overlaid on a light blocking pattern on the mask substrate.

Figure 6A:
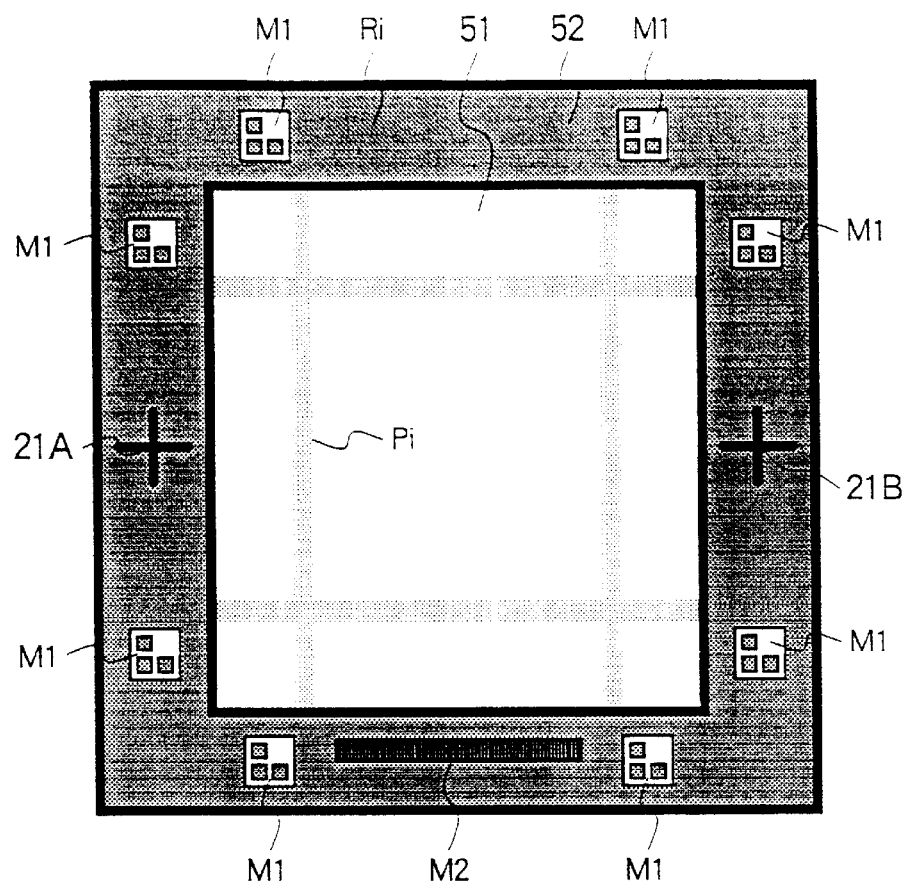
FIG. 6A is a plan view of the configuration of a master reticle in an embodiment of the present invention.

Next, a detailed explanation will be given of a master reticle Ri in the embodiment of the present invention. In the following explanation, for simplification, the explanation will be made of production of a working reticle using four master reticles. As shown in FIG. 6A, the light blocking area (peripheral area) 52 outside of the area 51 where the pattern (device pattern) of the master reticle Ri is formed (pattern area) is formed with two alignment marks 21A and 21B, while the peripheral area 52 is further formed with a plurality of first master identification marks M1 and second master identification marks M2.

The first master identification mark M1, in the present embodiment, is a mark for indicating transfer position information showing the position on the substrate 4 to which the master reticle Ri is to be transferred and a mark for spatial image measurement for finding by parameters used for various correction processing by spatial image measurement. The first master identification mark M1 is not particularly limited in number or position, but in this embodiment, two each are arranged at each of the sides (boundary line parts of pattern area 51 and peripheral area 52) of the pattern area 51.

Figure 6B:
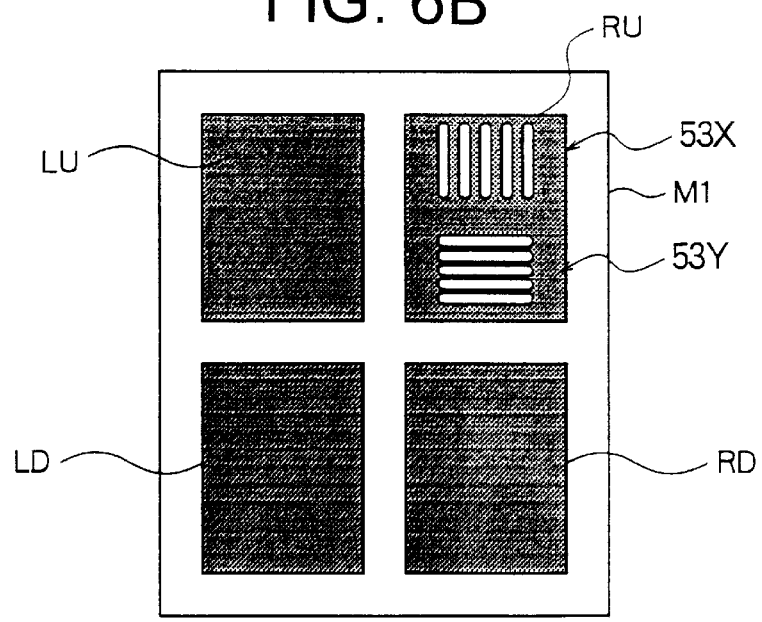
FIG. 6B is a view of one example of a mask formed on a master reticle in an embodiment of the present invention.

Each of the first master identification marks M1, as shown in FIG. 6B, has four display areas of the top right RU, bottom right RD, top left LU, and bottom left LD and a pair of mark elements 53X and 53Y displayed at one of these. The mark elements 53X and 53Y are comprised of line-and-space patterns comprised of a plurality of slits intermittently arranged. The longitudinal direction of the slits of the mark element 53 and the longitudinal direction of the slits of the mark element 53Y are formed to perpendicularly intersect each other.

Further, the four display areas RU, RD, LU, and LD are for showing the positions on the substrate 4 where the master reticle Ri is to be transferred. The positions at which the mark elements 53X and 53Y comprised of the line-and-space patterns are formed show the position on the mask substrate 4 where the pattern image of the master reticle Ri is to be transferred. That is, the master reticle of FIG. 6A means the pattern to be transferred on the top right area on the substrate 4 is formed. Here, the explanation is given taking as an example the case of production of a working reticle 34 by four master reticles Ri. The transfer position is identified by the four display areas RU, RD, LU, and LD. When producing a working reticle from a greater number of master reticles, it should be identified by columns and rows in the exposure map at the time of exposure on the substrate 4.

Figure 7:
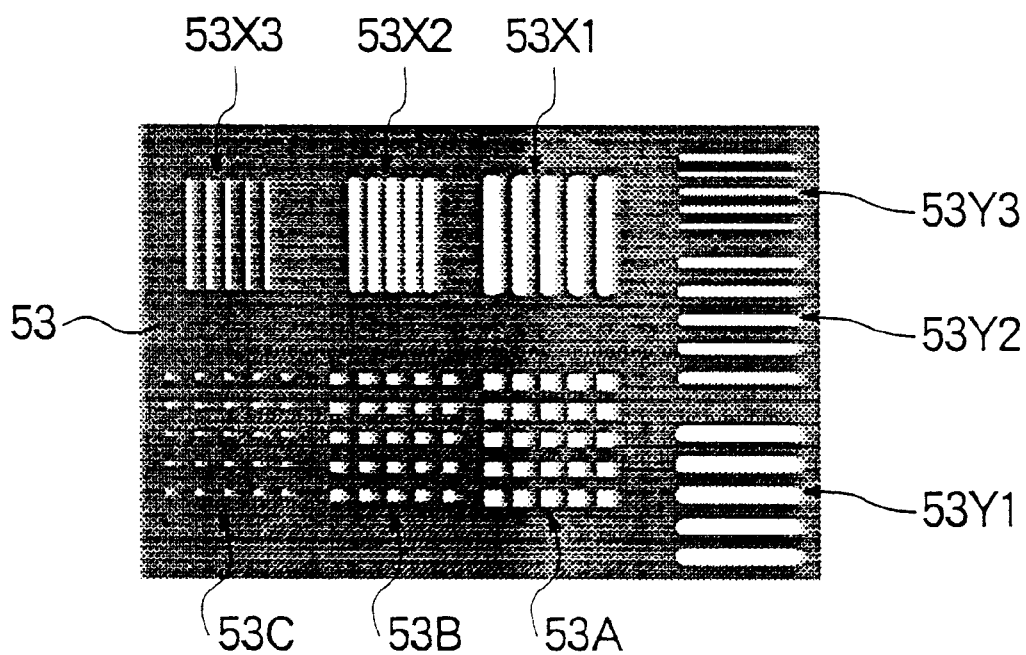
FIG. 7 is a view of another example of a mask formed on a master reticle in an embodiment of the present invention.

Note that the mark element of the first master identification mark M1 is comprised of the pair of mark elements 53X and 53Y here, but may also be comprised of a single mark element or, as shown in FIG. 7, may be comprised of a combination of a plurality of mark elements 53X1, 53X2, 53X3, 53Y1, 53Y2, 53Y3, 53A, 53B, and 53C. The mark element may be arrangements 53X1 to 3 and 53Y1 to 3 of slits and also matrix arrangements 53A to C of a plurality of pinholes (including circular, rectangular, or other shapes). Further, the mark element may also be a combination of slits of different thicknesses (widths) or intervals of arrangement such as 53X1 to 3 or 53Y1 to 3 or pinholes of different sizes (diameters etc.) or intervals of arrangement such as 53A to C.

For the configuration of the mark element of the first master identification mark M1, it is possible to use one of the shape corresponding to the pattern Pi formed on the pattern area 51. When the pattern Pi is a line-and-space pattern, use should be made of the arrangement of slits 53X1 to 3 and 53Y1 to 3, while when the pattern Pi is an isolated pattern or a contact hole (C/H) pattern, use should be made of an arrangement of isolated patterns (not shown) or pinholes 53A to C. If the first master identification mark M1 differs in shape between the master reticles Ri, this is sometimes not desirable from the viewpoint of standardization etc. Therefore, it is possible to use a combination of a plurality of types of mark elements as shown in FIG. 7 and to make measurements by selecting and combining corresponding mark elements in accordance with the shape or type of the pattern formed on the pattern area 51.

Further, the second master identification mark M2, as shown in FIG. 6A, is a bar code mark formed on a light blocking area 52 of the master reticle Ri. The bar code is a mark set with identification information (ID number etc.) for identification of one master reticle Ri from another master reticle. The storage device 11 (exposure data file) of FIG. 2 is set with reticle information relating to the master reticle Ri corresponding to the identification information given to the plurality of master reticles Ri.

As the reticle information, for example, the name of the product, the name of the layer, the various exposure conditions (exposure times for various mask reticles Ri, focus position, blind size, illumination conditions, shot magnification, etc.), various correction information (correction values for canceling deformation accompanying support of the master reticle Ri, aberration of the projection optical system PL, and deformation accompanying support of the blank) are set. Note that it is also possible to set transfer position information indicating the position on the substrate 4 to which the pattern of the master reticle Ri is to be transferred in the reticle information, but here the transfer position information is set in the first master identification mark M1, so this may or may not be included in the reticle information.

These first master identification marks M1 and second master identification marks M2 are formed using an electron beam lithography system, laser beam lithography system, projection exposure apparatus (stepper or scanner), etc. simultaneously with or by a separate process from the formation of the alignment marks 21A and 21B.

Figure 8:
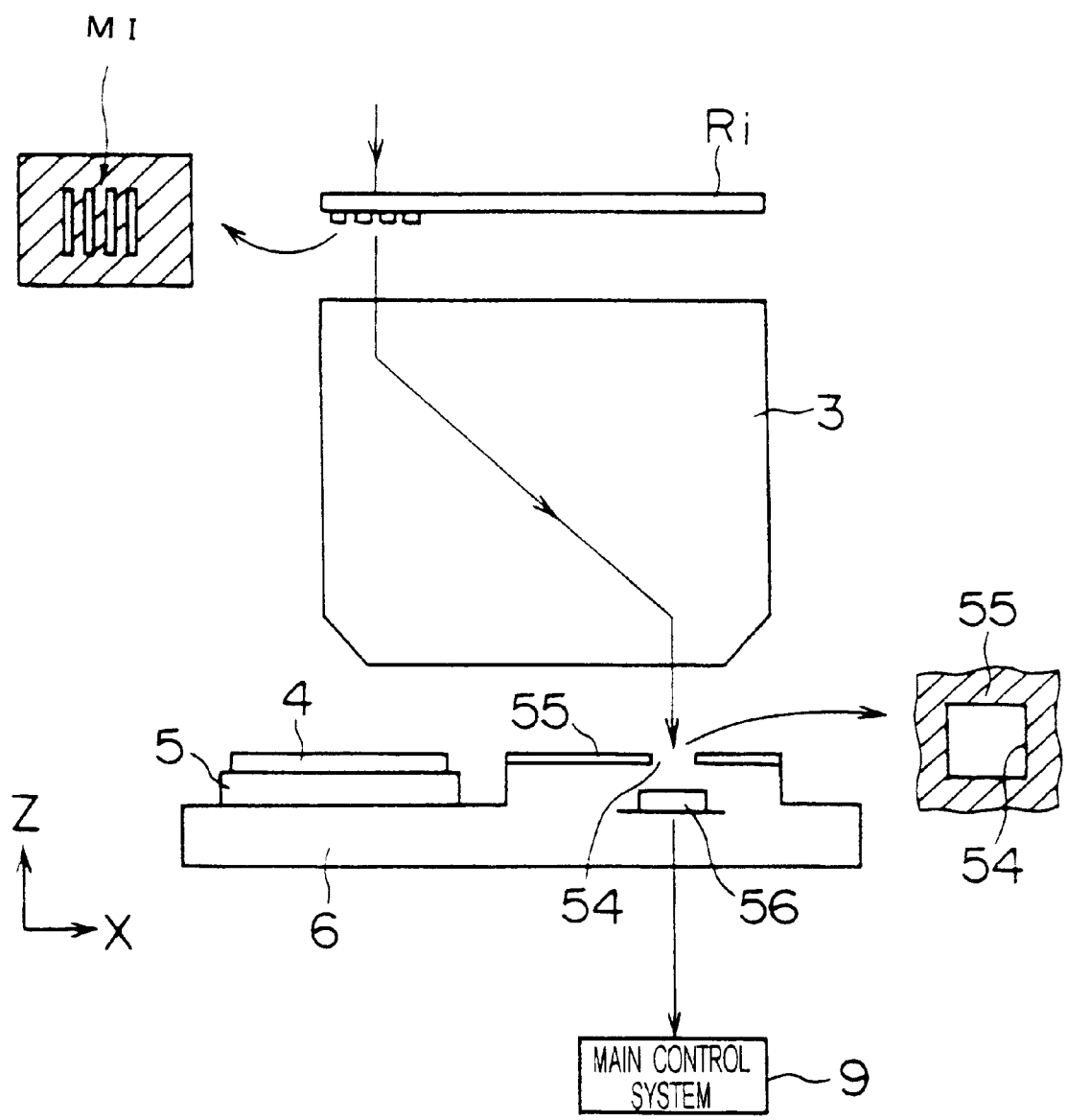
FIG. 8 is a view of the configuration of a spatial image measurement apparatus in an embodiment of the present invention.

Next, an explanation will be made of measurement of the marks formed on the master reticle. First, the spatial image measurement using the first master identification marks (spatial image measurement marks) is performed as follows. Note that spatial image measurement is disclosed in for example Japanese Unexamined Patent Publication (Kokai) No. 8-83753 and its corresponding U.S. Pat. No. 5,650,840 or Japanese Unexamined Patent Publication (Kokai) No. 9-153448 and its corresponding U.S. Pat. No. 5,841,520. The disclosure of these publications and the U.S. patents are incorporated by reference and made part of the disclosure of this description in so far as allowed by the domestic laws of the designated countries or elected countries designated or elected in this international application. FIG. 8 shows a spatial image measurement apparatus. In FIG. 8, a light receiver for measuring the image of the first master identification mark M1, formed on the peripheral area 52 of the master reticle Ri, projected by the projection optical system is provided on the XY stage 6. This light receiver is comprised of a photoelectric sensor (photoelectric conversion element) 56 provided below a light receiving plate 55 having an aperture 54 of a rectangular shape (in this embodiment, a square shape) as illustrated. The output signal of the photoelectric sensor 56 is input to the main control system 9. Note that it is also possible not to provide the photoelectric sensor 56 under the aperture 54, but to guide the light by a light guide etc. and detect the projected image by a photoelectric sensor etc. at another portion (for example, outside the XY stage 6).

Figure 9A:
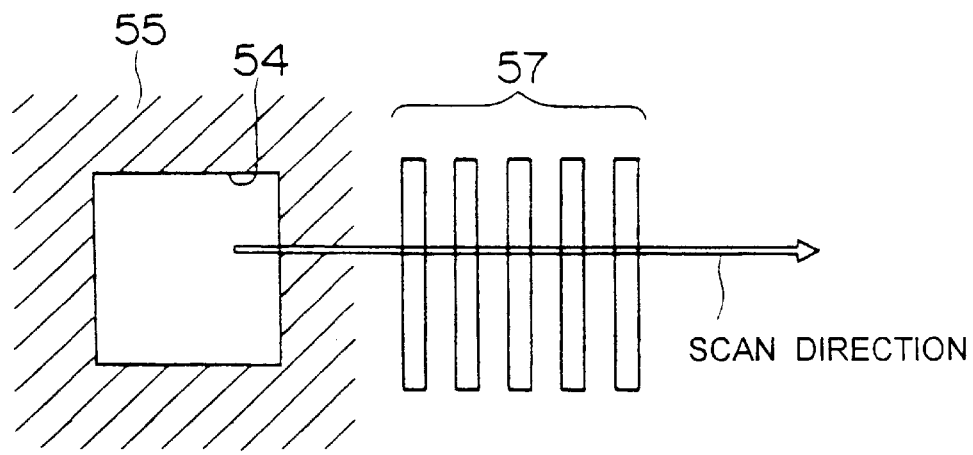
FIG. 9A is a view of the state of scanning of a projected image of a mask for explaining spatial image measurement in an embodiment of the present invention.
Figure 9B:
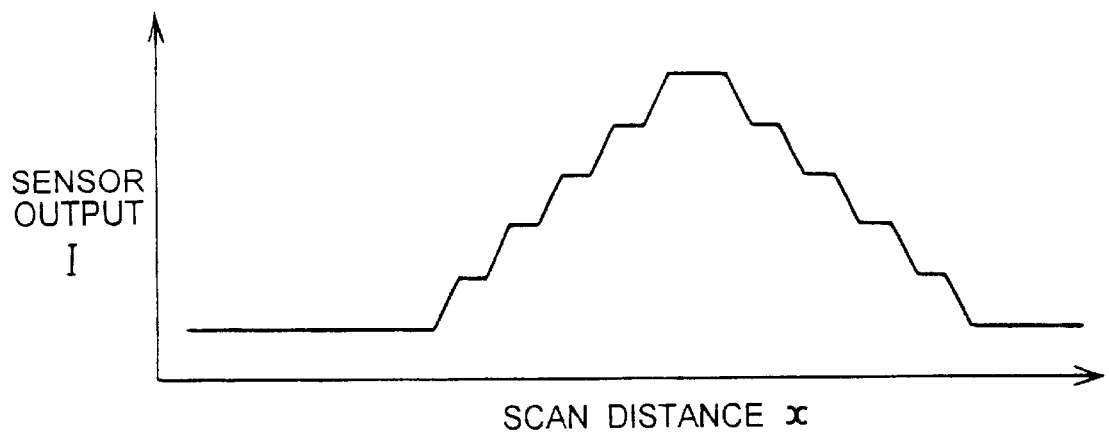
FIG. 9B is a view of the output of a photoelectric sensor for explaining spatial image measurement in an embodiment of the present invention.

Illuminating the master reticle Ri, an image of the first master identification mark M1 (mark element 53X or 53Y) projected by the projection optical system 3 is formed on the surface of the light receiving plate 55. In the state with the XY stage 6 moved by the main control system 9 to bring the light receiver of the spatial image measurement apparatus near the position corresponding to one of the projected images of the first master identification marks M1, as shown in FIG. 9A, the aperture 54 of the light receiver is moved over (scans) the projected image 57, whereby a signal such as shown in FIG. 9B is detected by the photoelectric sensor 56. That is, the leading slit image in the scan direction among the plurality of slits of the first master identification mark M1 appears in the aperture 54, the adjoining slit images successively appear in the aperture 54, all of the slit images appear in the aperture 54, then they successively move out of the aperture 54 until finally all of the slit images move out of the aperture 54.

Figure 9C:
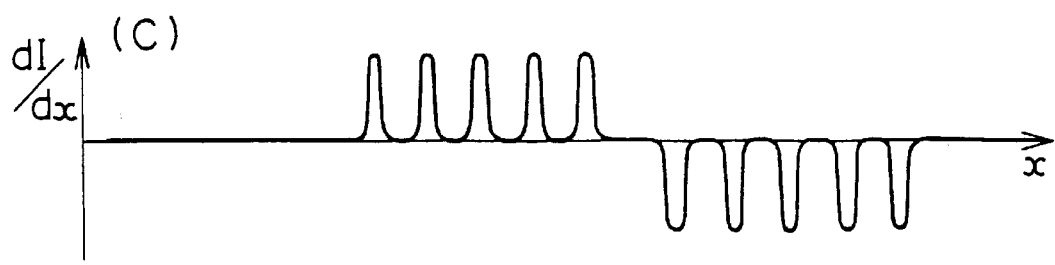
FIG. 9C is a view of a differential signal for explaining the spatial image measurement in an embodiment of the present invention.

At this time, as shown in FIG. 9B, the output (amount of light received) I of the photoelectric sensor 56 increases in steps, peaks, then decreases in steps along with movement of the projected images 57 of the slits through the aperture 54. Next, by finding the differential signal (dI/dx) of FIG. 9B to detect the coordinate position of the XY stage at the center point of the signal waveform shown in FIG. 9C, it is possible to measure the position of the projected image of the first master identification mark M1 in the X-direction (or Y-direction). Further, this measurement may be performed at a plurality of Z-positions to detect the position in the Z-direction where the intensity of the differential signal peaks so as to detect the imaging plane (focal position). Therefore, by making the stage move in the Z-direction and X-direction or the Y-direction alone or at a tilt, it is possible to detect the projected image at the optimal imaging plane and possible to improve the accuracy of the detection. The spatial image measurement using the first master identification mark M1 is performed after alignment of the reticle Ri by the reticle alignment marks 21A and 21B. The results of the measurement are stored and held in the storage device 11.

Figure 10:
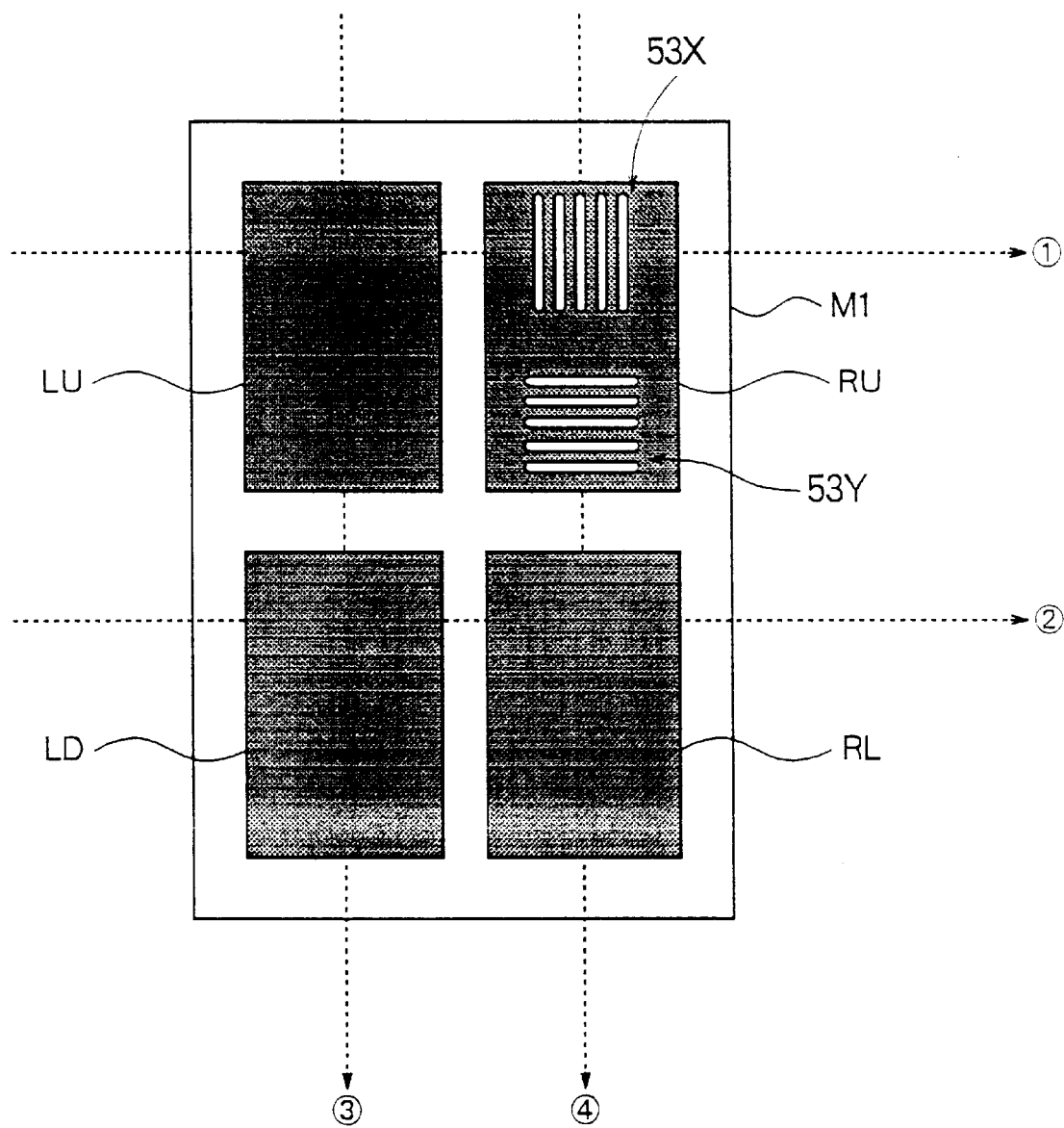
FIG. 10 is a view for explaining detection of a transfer position of a master reticle in an embodiment of the present invention.

Further, for detection of the transfer positional information using the first master identification marks (transfer position display marks) M1, the above spatial image measurement apparatus is used or a simple measurement apparatus having a separately provided photoelectric sensor etc. is used, as shown in FIG. 10, to scan two locations in the X-direction ((1) and (2)) and two locations in the Y-direction ((3) and (4)) and detect at which scan a signal from a mark is detected. That is, by detecting at which of the four display areas RU, RD, LU, and LD of the first master identification mark M1 the mark elements 53X and 53Y are formed, the position on the substrate 4 where the pattern image of the master reticle Ri is to be transferred is detected. For example, in the case where a signal is obtained from the scan positions (1) and (4) (case of FIG. 10), it is recognized that the master reticle is for exposure at the top right on the substrate 4. Note that regarding the detection of the first master identification marks M1 for obtaining the transfer position information, it is not necessary to detect all of the first master identification marks M1 on the master reticle Ri. It is sufficient to detect one of them.

The second master identification mark (bar code mark) M2 is read by a not shown bar code reader. The exposure data file of the storage device 11 is searched through based on the identification information indicated by the bar code read by the bar code reader and the corresponding reticle information is extracted.

Figure 11:
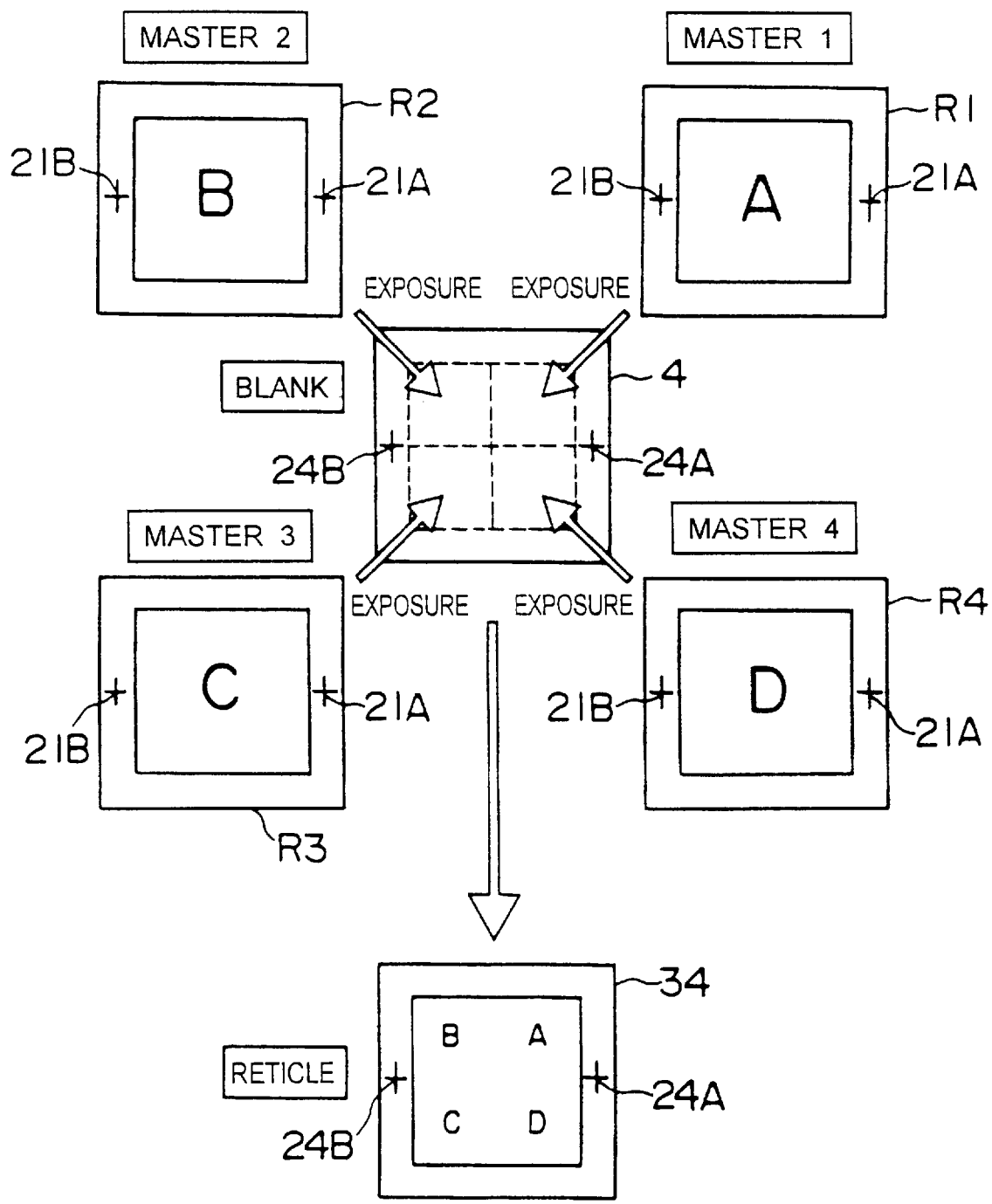
FIG. 11 is a view of the relationship among a master reticle (master), blank (photomask use substrate), and working reticle used in an embodiment of the present invention.

Next, refer to FIG. 11. Here, for simplification, the explanation will be given taking as an example the case of production of a working reticle 34 using the four master reticles (masters 1 to 4) R1 to R4. As shown in the figure, a working reticle 34 is produced by transferring and forming patterns of the masters 1 to 4 on corresponding positions on the substrate (blank) 4. Note that the transfer position information by the first master identification mark M1 of the masters 1 to 4 are the top right RU for the master 1, the top left LU for the master 2, the bottom left LD for the master 3, and the bottom right RD for the master 4. Further, the operator (worker) is assumed to recognize that the product name or layer name etc. of the working reticle to be produced is "256 MB DRAM, fourth generation, wiring 1 process) and that one working reticle is produced from four master reticles R1 to R4.

The operator specifies the four masters 1 to 4 for the "256 MB DRAM, fourth generation, wiring 1 process" from the reticle storage room and sets them in the reticle library 16 of the reticle exposure apparatus. At this time, there is no need to consider at all the positions on the substrate 4 to be exposed on by the masters 1 to 4, the order, the corresponding exposure conditions, the correction values, etc. It is sufficient to simply suitably set them. For example, there is not necessarily a need for setting the masters 1 to 4 in the order of 1, 2, 3, and 4. An order of 1, 2, 4, and 3 or another order is also possible.

When the operation of the reticle exposure apparatus is started, any one master (at this point, which master is unclear) is loaded from the reticle library 16 on to the reticle stage 2. For the master on the reticle stage 2, alignment including measurement of the alignment marks 21A and 21B, detection and measurement of the first master identification mark M1 including detection of the transfer position information and spatial image measurement, and detection of the second master identification mark M2 for detection of the identification information are performed. The position on the substrate 4 (step pitch X, Y) to which the master is to be transferred is specified by the transfer position information detected from the first master identification mark M1, and the corresponding reticle information is extracted from the storage device (exposure data file) 11 based on the identification information detected from second master identification mark M2. The various parameters (for example, the exposure time, focus position, illumination conditions, shot XY magnification correction values, etc.) are set based on the reticle information.

Based on the results of the spatial image measurement of the first master identification mark M1, the various correction values of the shot distortion, shot XY magnification, shot rotation, etc. are calculated by predetermined calculation using the least square method etc. and corresponding correction values are set in a corresponding device (leveling device, magnification adjustment device, etc.) for these corrections so that the amount of deviation of the position of the projected image of the first master identification mark M1 (image position) from the corresponding ideal lattice (position in design) becomes smaller.

When the master is for example the master 1, the transfer position information of the first master identification mark M1 is the top right RU, so the XY stage 6 is positioned in accordance with the result of detection of the first master identification mark M1 and exposure is performed in accordance with various exposure conditions. Next, the next master is exchanged and similar exposure performed to form a pattern on the substrate 4 while stitching. In this way, the reticle exposure apparatus successively loads four masters on the reticle stage 2 one at a time, detects the first and second master identification marks M1 and M2 of the master loaded on the reticle stage 2, finds the transfer positions on the substrate 4 and the various exposure conditions, and exposes accordingly to produce the working reticle 34.

As one example of the correction information set in the exposure data file of the above storage device 11, an explanation will be given below of flexing accompanying support of the substrate (blank) 4. The substrate 4 supported (held) on the substrate holder on the sample table 5 of the reticle exposure apparatus deforms in accordance with the support method such as three-point support, four-point support, point contact, facial contact, mechanical clamping, vacuum chucking, simple placement, support positioning, etc., the thickness, size, and other shapes and materials of the substrate 4 and for example flexes due to its own weight with three-point support etc.

Further, FIG. 12 schematically shows the state of the substrate 4 flexing due to its own weight when simply placed by three-point contact. If taking note of for example a square shot area of the substrate 4, in the state of flexing due to support, the shot deforms as shown by SH1 in the figure. Even if the pattern is transferred and formed accurately in that state, when returning to the ideal state free from flexing after being released from the three-point support, the deformation of the shot disappears as shown by SH2 in the figure and conversely distortion occurs in the pattern transferred and formed.

Figure 13A:
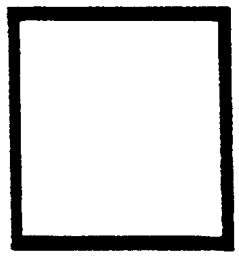
FIG. 13A is a view of the shape of a shot before deformation on the surface of a substrate in an embodiment of the present invention.
Figure 13B:
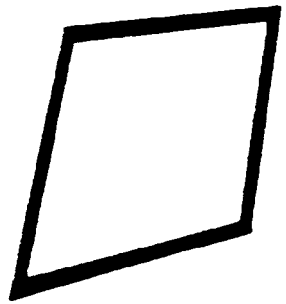
FIG. 13B is a view of the shape of a shot after deformation on the surface of a substrate in an embodiment of the present invention.

To eliminate this distortion of the pattern and transfer and form a pattern of an ideal shape, it is sufficient to perform exposure in a state giving pre-distortion to the projected image so as to cancel that distortion. For example, when the square shot shown in FIG. 13A deforms to the shape shown in FIG. 13B, at least one of the exposure conditions, for example, the lens controller for moving the optical elements of the optical system 3, reticle rotation, stepping position, scan speed, scan direction, etc., are adjusted so that the square shot shown in FIG. 13A becomes the shape shown in FIG. 13B.

Specifically, the procedure is as follows: In the state with the substrate 4 supported by a support method the same as the support method in the reticle exposure apparatus (FIG. 2), the amount of deformation from an ideal position of the surface of the substrate 4 (here, a point in a state assuming no flexing) is found by actual measurement at n number of points (n is an integer greater than 1) in the shot area to be exposed using the corresponding master or is found by calculation (simulation) and the results made (dxi,dyi). Here, i=1 to n. Here, considering a model where the point (x,y) of the surface of the substrate displaces to the point (X,Y) due to the deformation of the shot (magnification, rotation, orthogonality, and offset), the following equation (1) is obtained:

$$\begin{bmatrix} X \\ Y \end{bmatrix} = \begin{bmatrix} a & b \\ c & d \end{bmatrix} = \begin{bmatrix} x \\ y \end{bmatrix} = \begin{bmatrix} e \\ f \end{bmatrix} \qquad (1)$$

Here, a=(shot area magnification X)−1, b=−(shot magnification X)×(rotation+orthogonality), c=(shot magnification Y)×(rotation), d=(shot magnification Y)−1, e=(offset X), and f=(offset Y).

To find the deformation of the shot area, it is sufficient to find the a, b, c, d, e, and f giving the minimum E of the following equation (2) by the least square method:

$$E=\Sigma[(Xi-dxi)^2+(Yi-dyi)^2] \ldots \qquad (2)$$

The correction values a to f are found for each master reticle Ri and set in the exposure data file of the storage device 11. Based on this, the lens controller, reticle rotation, stepping position, and the like are finely adjusted to cause the projected image to deform as desired for exposure. Due to this, it is possible to reduce the error occurring due to deformation of the substrate 4, for example, flexing accompanying support, and possible to form a pattern with a higher accuracy. Note that here, the correction values a to f were calculated based on the amounts of deformation from the ideal shape of the substrate 4, but in a device exposure apparatus where the working reticle 34 produced using this substrate 4 is used, it is also possible to calculate the correction values a to f based on the amounts of deformation from the shape in the state where the working reticle 34 is supported and from the shape in other states.

Note that above an explanation was made of deformation of the substrate 4, but it is also possible to store and hold correction values for canceling or reducing the deformation occurring due to flexing accompanying support of the master reticle Ri, distortion or coma aberration or other aberration of the projection optical system 3, drawing error of the pattern of the master reticle Ri, or other error in an exposure data file of the exposure apparatus 11 and refer to this data based on identification information of the master reticle Ri (second master identification mark M2) to suitably correct the imaging characteristics (including focusing). Note that the correction values are found by actual measurement or calculation (simulation).

Next, an explanation will be made of an example of the operation in the case of exposure using the working reticle 34 of FIG. 1 produced in the above way.

FIG. 5 shows key parts of a reduction projection type exposure apparatus (device exposure apparatus) mounting a working reticle 34. In FIG. 5, a wafer W is arranged at the bottom surface of the working reticle 34 held on a not shown reticle stage through a projection optical system 42 having a reduction magnification $1/\beta$ ($\beta$ is 5, 4, etc.) A photoresist is coated on the surface of the wafer W. The surface is held to be in register with the image plane of the projection optical system 42. The wafer W is held on the sample table 43 through a not shown wafer holder, while the sample table 43 is fixed on an XY stage 44. By driving the XY stage 44 based on the coordinates measured by the movable mirrors 45mX and 45mY on the sample table 43 and the corresponding laser interferometers, the wafer W is positioned.

Further, a fiducial mark member 46 formed with fiducial marks 47A and 47B is fixed on the sample table 43. The working reticle 34 is formed with alignment marks 24A and 24B so as to straddle the pattern area 25 in the X-direction. When the alignment marks 24A and 24B are alignment marks for transferring a pattern on to a pattern area 25 of the working reticle 34, if the marks are used for alignment of the working reticle 34, the relative positional error of the alignment marks 24A and 24B and the pattern area 25 can be expected to be reduced. Alignment sensors 41A and 41B for reticle alignment are arranged above the alignment marks 24A and 24B. In this case as well, the fiducial marks 47A, 47B, the alignment marks 24A, 24B, and the alignment sensors 41A, 41B are used for alignment of the working reticle 34 with respect to the sample table 43 (orthogonal coordinate system XY defined by two laser interferometers).

Next, when performing overlay exposure, a not shown wafer alignment sensor is used for alignment of the shot areas 48 on the wafer W. Next, the shot areas 48 on the wafer W to be exposed are successively positioned at the exposure position, then excimer laser light or other exposure light IL1 is focused on the pattern area 25 of the working reticle 34 by a not shown illumination system, whereby an image 27W of the master pattern 27 in the pattern area 25 reduced by a reduction rate $1/\beta$ is exposed on the shot area 48. After the reduced image of the master pattern 27 is exposed on each shot area of the wafer W by a step-and-repeat system in this way, the wafer W is developed, etched, and otherwise processed, whereby the circuit pattern of a layer of the semiconductor device is formed in each shot area of the wafer W. Note that it is also possible to use the step-and-scan method for scan exposure of each shot area of the wafer W.

According to the reticle exposure apparatus of the above embodiment of the present invention, by forming the first master identification marks M1 and second master identification marks M2 at the peripheral area 52 around the pattern area 51 where the pattern Pi of the master reticle Ri is formed, detecting the transfer position on the substrate 4 where the pattern of a master reticle Ri is to be formed by the first master identification marks M1, detecting the identification information for identifying the master reticle Ri from another master reticle by the second master identification marks M2, and performing exposure based on this information, if the operator (worker) of the reticle exposure apparatus specifies the master reticles required for the working reticle to be produced and sets them suitably in the reticle library 16, there is no need to input other information etc., the number of work steps can be greatly reduced, there are no longer input errors of information etc., and the efficiency of production of a working reticle can be greatly improved.

Further, the first master identification marks M1 serve also as spatial image measurement marks. If finding various correction values by spatial image measurement of the first-master identification marks M1 or extracting the correction values stored in the reticle information and making corrections based on these, it is possible to improve the positional accuracy or connection accuracy of the patterns and produce a photomask (working reticle) 34 having a high accuracy master pattern.

Note that the present invention is not limited to the above embodiment. It is of course possible to use various configurations within a scope not exceeding the gist of the present invention.

For example, in the above embodiment, a plurality of first master identification marks M1 were formed on the master reticle Ri, but this was done for spatial measurement at a plurality of locations on a master reticle Ri to find correction values for various types of error, but the number may be one or a small number or a large number. Similarly, the second master identification mark M2 was made a single mark, but may also be a plurality of marks. Further, it is possible to form either of the first master identification mark M1 and second master identification mark M2 or another master identification mark. For example, it is possible to not set the transfer position information at the first master identification marks M1, that is, make the first master identification marks M1 function only as spatial image measurement marks or not provide the first master identification marks M1 and store transfer position information corresponding to the identification information (ID number etc.) of the master reticle obtained by detection of the second master identification marks in the above-mentioned storage device (exposure data file) 11 together with the reticle information. Further, the configurations of the first master identification marks M1 and second master identification marks M2 are not limited to the above. In the above embodiment, the transfer position was identified by the presence of mark elements 53X, 53Y at any of the four display areas RU, RD, LU, LD of the first master identification marks M1, but it is also possible to give meaning to the number of line-and-space patterns or pitch of arrangement etc. of the mark elements to set transfer position information or other information. Further, to detect the first master identification marks M1 or second master identification marks M2, it is possible to use the above-mentioned spatial-image measurement apparatus or alignment sensor or other apparatus for detecting items other than the master identification marks or to separately provide a detection apparatus exclusively for the master identification marks.

Further, in the above embodiment, the second master identification mark M2 was made a bar code mark set with identification information for identification of one master reticle from another master reticle. The reticle information corresponding to the identification information is stored in the storage device (exposure data file) 11, but it is possible to set the reticle information in the second master identification mark M2 itself. By doing this, it is possible to reduce the storage area of the storage device 11. The second master identification mark M2 is not limited to a bar code. A matrix code, letters, symbols, or other codes can also be used. Further, in the above embodiment, the first master identification marks M1 formed on a master reticle Ri are made spatial image measurement marks suited for measurement by the spatial image measurement method, but they may also be diffraction grating marks. Note that the exposure data file 11 storing the reticle information etc. may be in the exposure apparatus itself (minicomputer etc.) or may be read from a host computer connected to a plurality of manufacturing facilities (exposure apparatuses, coater developers, etc.)

Further, in the above embodiment, the master reticle Ri is aligned by measuring the alignment marks 21A and 21B, but it is also possible to align it by using the first master identification marks M1 etc. By doing this, it is no longer necessary to form marks just for alignment and therefore the efficiency is higher. At this time, it is also possible to detect the master identification marks used also as the alignment marks not by a spatial image measurement apparatus or bar code reader, but also an alignment sensor. Further, the alignment sensor 23 for detecting the marks on the substrate 4 is not limited to an off-axis type. It is also possible to use a TTL (through-the-lens) type or a TTR (through-the-reticle) type. Further, it is possible to use not only broad band light, but also a single wavelength laser light or multiwavelength light etc. Further, it is possible to use a system for photoelectric detection of the diffracted light or scattered light generated from the mark instead of the image processing system.

It is possible to employ various methods for correction of the imaging characteristics based on the above-mentioned reticle information or results of the spatial image measurement. For example, it is also possible-to shift the position of the master reticle in the image field of the projection optical system 3, that is, the plane orthogonal to the optical axis, or move the master reticle in a direction parallel to the optical axis to tilt the master reticle with respect to the physical plane of the projection optical system 3 (plane orthogonal to the optical axis). Further, it is possible to enable movement of at least one of the optical elements of the projection optical system 3 and adjust the optical performance of the projection optical system 3 (imaging characteristics) or shift the center wavelength of the exposure light IL slightly from the reference value. Further, it is possible to make the image plane of the projection optical system 3 and the substrate 4 relatively move based on the output of a tilt_incidence light type focus sensor for detecting the position of the substrate 4 with respect to the optical axis direction (Z-direction) of the projection optical system 3.

Further, it is also possible to correct the imaging characteristics by a plurality of master reticles used for the production of a working reticle or correct the imaging characteristics by only a specific master reticle. Further, it is possible to adjust for example the projection magnification for one or more master reticles among all of the master reticles to correct the imaging characteristics and to for example rotate the reticle for other master reticles to correct the imaging characteristics. Note that it is also possible to correct the imaging characteristics of the master reticles.

Further, when using an exposure apparatus (stepper) for keeping the master reticle and the substrate substantially stationary and transferring the pattern to the substrate (stepper), it is possible to divide the pattern of the master reticle into a plurality of sections by a reticle blind (field stop) arranged in the illumination system 1 and transfer them to the substrate and to correct the imaging characteristics for each of the plurality of sections on the master reticle.

Further, when transferring the pattern of a master reticle to the substrate 4 using the scan type exposure apparatus, the master reticle and the substrate are moved relatively with respect to the projection optical system 3. Therefore, in a scan type exposure apparatus, it is possible to drive the reticle blind (field stop) arranged in the illumination system 1 and define the illumination region of the exposure light on the master reticle to shift the position of the illumination region in the image field of the projection optical system 3. Further, it is possible to correct the imaging characteristics by slightly shifting the scan direction of the master reticle and substrate for synchronous movement or slightly rotating the master reticle for synchronous movement in that state. Further, it is possible to correct the imaging characteristics by moving at least one optical element in the projection optical system 3. In addition, it is possible to correct the imaging characteristics by shifting the scan speed from a predetermined speed ratio between the master reticle Ri and the substrate 4.

Further, since a plurality of master reticles Ri are successively exchanged to transfer master patterns Pi on the substrate 4, the time required for exposure of the substrate 4 becomes comparatively longer than for exposure of the wafer W using the working reticle 34. Further, when the projection exposure apparatus of FIG. 2 uses an excimer laser as exposure light, a chemical amplification type resist is used for the resist 4. Therefore, sometimes the line width of the pattern image of for example the first master reticle R1 in the plurality of pattern images (resist pattern) formed on the substrate 4 does not become the target line width after the development. This is considered to arise due to the difference in time from exposure until development (or baking) for each master reticle. Therefore, it is desirable to find the amount of change of line width for each master reticle by measurement or simulation and finely adjust the amount of exposure of the substrate 4 (resist) in accordance with the amount of change at the time of transfer of the master pattern. Due to this, since the amount of exposure is adjusted for each master pattern, the change in line width of the resist pattern can be kept to a minimum.

The device pattern obtained by enlarging the device pattern formed on the working reticle 34 may be divided into each of the element patterns, for example, divided into the dense patterns and isolated patterns, or divided into each of the functional blocks to form master reticles so as to eliminate or reduce the stitched portions of the adjoining patterns on the substrate 4. In this case, the master pattern of a single master reticle is sometimes transferred to a plurality of areas on the substrate 4, so it is possible to reduce the number of the master reticles used for the production of the working reticle. In this case, however, it is necessary to store and hold the correction values based on the positions on the substrate 4 where the master patterns are to be transferred (for example, the correction values relating to the flexing accompanying support of the substrate 4) in the reticle information.

Note that the "stitching" in the specification of the present application means not only stitching of patterns, but also arrangement of one pattern and another pattern in a desired positional relationship. Regardless of the presence of the stitched portions of the patterns, the shot areas to which the patterns are transferred partially overlap with the adjoining shot areas. That is, the overlay parts are exposed multiple times.

Further, sometimes an identification code (bar code or 2-dimensional code etc.) including identification information (ID number etc.) is formed on the working reticle 34. In this case, it is desirable to form a pattern of the identification code enlarged by a on a master reticle Ri the same as one of the plurality of master patterns Pi or a master reticle exclusively for the identification code and transfer the reduced image of the identification code on the substrate (blank) 4 together with the plurality of master patterns using the reticle exposure apparatus of FIG. 2 by an electron beam lithography system, laser beam lithography system, optical type projection exposure apparatus, etc. Note that instead of using a reticle exposure apparatus (master reticle), it is also possible to directly draw (form) the identification code on the substrate 4 using an electron beam lithography system or laser beam lithography system etc. Similarly, it is possible to form alignment marks or spatial measurement marks or information other than these (letters etc.) on the working reticle 34.

Further, when successively transferring a plurality of master patterns Pi on the substrate 4, the substrate sometimes deforms due to heat due to the irradiation of the exposure light IL. Therefore, when the amount of deformation occurring due to irradiation by exposure light cannot be ignored, it is preferable to find the amount of deformation by actual measurement or calculation (simulation) to determine the above correction values a to f.

In the above embodiments, the exposure apparatus shown in FIG. 5 was explained as one used for production of a semiconductor device, but it may also be an exposure apparatus etc. used for the production of a display device including liquid crystal display or plasma display, a thin film magnetic head, a pickup element (CCD), a vibrator used in a cellular phone or home game system, etc.

In the exposure apparatus of FIG. 5, the projection optical system 42 was a reduction system, but the projection optical system 42 may also be an equal magnification system or an enlargement system. Further, the projection optical system 42 may be any of a dioptric system comprised of only a plurality of refraction elements, a catoptric system comprised of only a plurality of reflection elements, and a catadioptric system comprised of refraction elements and reflection elements. Further, the exposure apparatus of FIG. 5 may be of the proximity type or a contact type not using a projection optical system or a stationary exposure type and scan exposure type.

Further, the exposure apparatus of FIG. 5 is not limited to a step-and-repeat system or step-and-scan system and may also be a step-and-stitch system which partially overlays a plurality of shot areas on a substrate 4 to transfer one pattern on the plurality of shot areas. Further, the exposure apparatus of FIG. 5 may also be a mirror projection system forming a plurality of patterns on the entire surface of the photosensitive substrate by a single scan exposure. Note that in the step-and-stitch system, when transferring a pattern to the shot areas, either of the stationary exposure system or the scan exposure system may be used. The scan exposure system is disclosed in for example Japanese Unexamined Patent Publication (Kokai) No. 4-196513 and its corresponding U.S. Pat. No. 5,473,410. The disclosure of this publication and the U.S. patent are incorporated by reference and made part of the disclosure of this description in so far as allowed by the domestic laws of the designated countries or elected countries designated or elected in this international application.

Further, in the exposure apparatus of FIG. 5, it is possible to use as the exposure use illumination light, g-rays (wavelength 436 nm) or i-rays (wavelength 365 nm) emitted from a mercury lamp or a higher harmonic of a KrF excimer laser (wavelength 248 nm), an ArF excimer laser (wavelength 193 nm), an $F_2$ laser (wavelength 157 nm), an $Ar_2$ laser, and metal vapor laser or YAG laser. Further, it is also possible to amplify an infrared region or visible region single wavelength laser light emitted from a DFB semiconductor laser or fiber laser by for example an erbium (or both erbium and yttrium) doped fiber amplifier and use the harmonic obtained by converting the wavelength to ultraviolet light using a nonlinear optical crystal (details explained later). Further, the exposure use illumination light is not limited to the above far ultraviolet band or vacuum ultraviolet band (wavelength 120 to 200 nm) and may also be a soft X-ray region generated from a laser plasma light source or SOR (wavelength of about 5 to 50 nm), for example, EUV (extreme ultraviolet) light of a wavelength of 13.4 nm or 11.5 nm or soft X-ray region (wavelength not more than 1 nm). Note that in an EUV exposure apparatus, a reflection type reticle (mask) is used. Also, the projection optical system is a catoptric system which is a reduction system telecentric at only the imaging plane side and is comprised of a plurality of (3 to 6) reflection optical elements.

Further, the present invention may also be applied to a device exposure apparatus using an electron beam, ion beam, or other charged particle beam. Note that an electron beam exposure apparatus may be of the direct drawing type (for example, including a cell projection system, variably shaped beam system, aperture array system, etc.) or a projection system (for example a system exposure an area of about 250 nm square on a photosensitive substrate at one time using a transmission type mask). In the direct drawing system, no mask is used, but it is also possible to use an exposure apparatus according to the present invention to produce a cell, aperture, etc. used for shaping an electron beam.

In this way, the exposure apparatus of FIG. 5 may be of any configuration or system so long as using a mask or reticle (including cell or aperture). On the other hand, the exposure apparatus for production of a mask or reticle (FIG. 2 to FIG. 4) may be any configuration or system similar to that of the above-mentioned exposure apparatus for production of a device (FIG. 5), but considering production of a master mask (master reticle) etc., is preferably a projection type, in particular a reduction projection type. Note that in the exposure apparatus shown in FIG. 2 to FIG. 4, the substrate 4 was fixed on the sample table 5, but to avoid deformation of the substrate 4 due to vacuum chucking or electrostatic chucking etc., it is desirable to support the substrate 4 at a plurality of points (for example three points) without chucking on the sample table 5.

In the above embodiments, however, use was made of a transparent substrate (silica glass etc.) as the substrate (blank) 4. This is because it is predicated on the exposure illumination light IL1 used in the exposure apparatus (FIG. 5) to which the substrate 4, that is, the working reticle 34, is applied being the vacuum ultraviolet band (wavelength df about 100 to 200 nm) or a wavelength band longer than that. Here, when the wavelength band of the exposure illumination light IL1 is at least about 190 nm, it is possible to use silica glass as the substrate 4, but with a wavelength shorter than that, in particular a wavelength of 100 to 180 nm, it becomes difficult to use silica glass as the substrate 4 in regard to the transmittance. Therefore, when the wavelength of the exposure illumination light IL1 is 100 to 180 nm, it is preferable to use for example fluorite, fluorine-doped silica glass, rock crystal, LiF, LaF$_3$, lithium-calcium-aluminum fluoride (LiCaAlF crystal), etc. as the substrate 4. Note that the mask material formed on the substrate 4 may be suitably selected in accordance with the type of the working reticle 34 and is not limited to the above-mentioned chrome etc.

In the above EUV exposure apparatus, a reflection type mask is used. A multilayer film comprised of several dozen alternately coated layers of silicon and molybdenum when the exposure wavelength is 13.4 nm or a multilayer film comprised of several dozen alternately coated layers of molybdenum and beryllium when the exposure wavelength is 11.5 nm is formed on the surface of the substrate 4. It is possible to use not only a glass substrate, but also a silicon wafer etc. as the substrate 4. In a proximity type X-ray exposure apparatus or electron beam or ion beam or other charged particle beam exposure apparatus etc., a transmission type mask (stencil mask, membrane mask) is used, so a silicon wafer etc. is used as the substrate 4.

The exposure apparatus of the present embodiment shown in each of FIG. 2 and FIG. 5 may be produced by affixing at least part of a projection optical system comprised of a plurality of optical elements assembled in a mirror barrel and an illumination system comprised of a plurality of optical elements (including optical integrator etc.) to a frame supported by a plurality of anti-vibration pads and optically adjusting the illumination system and the projection optical system and by connecting wiring and piping to the reticle stage (2) or wafer stage (sample table 5 and XY stage 6) comprised of the large number of mechanical parts and drive system (linear motor etc.), etc., arranging the fiducial mark member (12 or 46), photoelectric sensor (56), etc. to the wafer stage, and performing overall adjustment (electrical adjustment, confirmation of operation, etc.) Note that the exposure apparatus is desirably manufactured in a clean room controlled in temperature and cleanness etc.

The semiconductor device is produced through a step of design of the functions and performance of the device, a step of production of a working reticle by the exposure apparatus of FIG. 2 using the above master reticle based on the design step, a step of production of a wafer from a silicon material, a step of transferring a pattern of the working reticle on to a wafer using an exposure apparatus of FIG. 5, a step of assembly of the device (including dicing, bonding, packaging, etc.), and an inspection step.

As the light source, it is possible to use various ones other than those illustrated. For example, it is possible to use an infrared region or visible region single wavelength laser light emitted from a DFB semiconductor laser or fiber laser amplified by for example an erbium (or both erbium and yttrium) doped fiber amplifier and use the harmonic obtained by converting the wavelength to ultraviolet light using a nonlinear optical crystal.

For example, if the oscillation wavelength of the single wavelength laser is made a range of 1.51 to 1.59 μm, an 8th harmonic of an oscillation wavelength in the range of 189 to 199 nm or a 10th harmonic of an oscillation wavelength in the range of 151 to 159 nm is output. In particular, if the oscillation wavelength is made one in the range of 1.544 to 1.553 μm, ultraviolet light of an 8th harmonic in the range of 193 to 194 nm, that is, a wavelength substantially the same as that of an ArF excimer laser, is obtained. If the oscillation wavelength is made one in the range of 1.57 to 1.58 μm, ultraviolet light of a 10th harmonic in the range of 157 to 158 nm, that is, a wavelength substantially the same as that of an F$_2$ laser, is obtained.

Further, if the oscillation wavelength is made one in the range of 1.03 to 1.12 μm, a 7th harmonic of an oscillation wavelength in the range of 147 to 160 nm is output. In particular, if the oscillation wavelength is made one in the range of 1.099 to 1.106 μm, ultraviolet light of a 7th harmonic in the range of 157 to 158 nm, that is, a wavelength substantially the same as that of an F$_2$ laser, is obtained. Note that as the single wavelength oscillation laser, a yttrium-doped fiber laser is used.

All of the disclosure of Japanese Patent Application No. 10-316129, filed on Nov. 6, 1998, including the specification, claims, drawings, and abstract, are incorporated herein by reference in its entirety.

What is claimed is:

1. A method of performing stitching exposure on a plurality of regions on different positions on a substrate, comprising the steps of:

detecting an identification pattern formed on a mask having a pattern to be transferred to at least one of the plurality of regions, including information on the at least one region; and exposing the at least one region based on the information on the at least one region obtained by the detection of the identification pattern so as to transfer the mask pattern to the at least one region via a projection optical system.

2. A method according to claim 1, wherein the identification pattern includes information on the mask besides the information on the at least one region.

3. A method according to claim 2, wherein the identification pattern has a first pattern including the information on the at least one region and a second pattern which is different from the first pattern including the information on the mask.

4. A method according to claim 3, wherein the second pattern is a bar-code mark.

5. A method according to claim 2, wherein the information on the mask includes at least one of correction information used for alignment of a pattern image of the mask and the substrate and information on an exposure condition for the at least one region.

6. A method according to claim 1, wherein the identification pattern includes correction information for canceling at least one of deformation of the mask, aberration of the projection optical system and deformation of the substrate.

7. A method according to claim 1, wherein the identification pattern includes information on an exposure condition for the at least one region.

8. A method according to claim 1, wherein the identification pattern is detected in a state where the mask is held on a mask stage.

9. A method according to claim 1, wherein the identification pattern includes at least a bar-code mark.

10. A method according to claim 1, wherein the identification pattern includes a measurement mark by which a projection image is detected at least on an image plane side of the projection optical system.

11. A method according to claim 10, wherein alignment of the mask is carried out by using the identification pattern.

12. A method according to claim 1, wherein a part of an enlarged pattern of a device pattern to be formed on the plurality of regions by the stitching exposure is respectively formed on a plurality of masks including the mask, and the plurality of masks have an identification pattern including information on a specified region on which a part of the enlarged pattern is transferred among the plurality of regions; and a reduced image of the part of the enlarged pattern is transferred to the specified region via the projection optical system based on the information on the specified region obtained by the detection of the identification pattern for each of the masks.

13. A method according to claim 1, wherein during the stitching exposure, a part of the plurality of regions has a different exposure amount.

14. A method according to claim 13, wherein an exposure amount on the plurality of regions is respectively determined in accordance with a change amount of a line width of a pattern image to be transferred.

15. A process of producing a photomask comprising producing a photomask having a device pattern using a method of exposure as set forth in claim 1.

16. A photomask produced using a method of exposure as set forth in claim 1.

17. A process of producing a device using a photomask as set forth in claim 16.

18. An exposure apparatus for performing stitching exposure on a plurality of regions of different positions on a substrate via a projection optical system, comprising:

a holding unit which holds at respectively different positions a plurality of masks including a mask having a pattern to be transferred to at least one of the plurality of regions and an identification pattern including information on the at least one region;

a mask stage arranged on an object plane side of the projection optical system;

a transfer unit which respectively transfers the plurality of masks between the holding unit and the mask stage;

a substrate stage arranged on an image plane side of the projection optical system;

a detection device which performs detection by illuminating the identification pattern of the mask; and a control unit connected to the detection device, which controls exposure of the at least one region based on the information on the at least one region obtained by the detection of the identification pattern so as to transfer the mask pattern to the at least one region via the projection optical system.

19. An apparatus according to claim 18, wherein the identification pattern includes information on the mask besides the information on the at least one region.

20. An apparatus according to claim 19, wherein the information on the mask includes at least one of correction information used for alignment of a pattern image of the mask and the substrate and information on an exposure condition for the at least one region.

21. An apparatus according to claim 18, wherein the plurality of masks respectively have a part of an enlarged pattern of a device pattern to be formed on the plurality of regions by the stitching exposure and an identification pattern including information on a specified region on which a part of the enlarged pattern is transferred among the plurality of regions; and a reduced image of the part of the enlarged pattern is transferred on the specified region via the projection optical system based on the information on the specified region obtained by the detection of the identification pattern for each of the masks.

22. An apparatus according to claim 18, wherein during the stitching exposure, a part of the plurality of regions has a different exposure amount.

23. An apparatus according to claim 22, wherein an exposure amount on the plurality of regions is respectively determined in accordance with a change amount of a line width of a pattern image to be transferred.

24. A process of producing a photomask comprising producing a photomask having a device pattern using an exposure apparatus as set forth in claim 18.

25. A photomask produced using an exposure apparatus as set A forth in claim 18.

* * * * *